United States Patent [19]
Kinoshita

[11] Patent Number: 6,063,476
[45] Date of Patent: May 16, 2000

[54] METHOD OF FABRICATING PLASTIC MASK FOR PASTE PRINTING, PLASTIC MASK FOR PASTE PRINTING, AND PASTE PRINTING METHOD

[75] Inventor: Makoto Kinoshita, Tottori-ken, Japan

[73] Assignee: Ricoh Microelectronics Co., Ltd., Tottori, Japan

[21] Appl. No.: 09/209,473

[22] Filed: Dec. 11, 1998

Related U.S. Application Data

[62] Division of application No. 08/579,762, Dec. 28, 1995, Pat. No. 5,887,520.

[30] Foreign Application Priority Data

| Dec. 28, 1994 | [JP] | Japan | 6-328823 |
| Jan. 17, 1995 | [JP] | Japan | 7-005170 |
| Jan. 17, 1995 | [JP] | Japan | 7-005171 |

[51] Int. Cl.[7] ............... B32B 3/24; B50C 17/06
[52] U.S. Cl. ............ 428/131; 428/137; 428/134; 428/136; 428/212; 428/457; 428/220; 101/127; 101/128.21
[58] Field of Search .............. 428/131, 137, 428/134, 136, 212, 457, 220; 101/127, 128.21

[56] References Cited

U.S. PATENT DOCUMENTS

| 1,351,068 | 8/1920 | Sayford | 101/127 |
| 3,668,028 | 6/1972 | Short | 101/128.4 |
| 3,696,742 | 10/1972 | Parts et al. | 101/128.4 |
| 3,852,564 | 12/1974 | Baum et al. | 219/522 |
| 3,981,237 | 9/1976 | Rhodes | 101/128.2 |
| 4,211,618 | 7/1980 | Ohno | 204/11 |
| 4,285,274 | 8/1981 | Katsuuma | 101/128.21 |
| 5,460,316 | 10/1995 | Hefele | 228/39 |
| 5,483,883 | 1/1996 | Hayama | 101/128.4 |

FOREIGN PATENT DOCUMENTS

| 57-52585 | 3/1982 | Japan . |
| 57-165193 | 10/1982 | Japan . |
| 61-126987 | 6/1986 | Japan . |
| 61-286087 | 12/1986 | Japan . |
| 62-90241 | 4/1987 | Japan . |
| 3-723643 | 3/1991 | Japan . |
| 3-99890 | 4/1991 | Japan . |

*Primary Examiner*—William P. Watkins, III
*Attorney, Agent, or Firm*—Oblon, Spivak, McClelland, Maier & Neustadt, P.C.

[57] ABSTRACT

A method of fabricating a plastic mask for paste printing with a plastic sheet being irradiated with an excimer laser beam for forming at least one penetrating opening containing area including at least one through-hole in the plastic sheet is carried out by the steps of bringing a polymer film capable of absorbing at least part of the excimer laser beam into close contact with a back surface of the plastic sheet which is opposite to an excimer laser beam irradiation side thereof which is to be irradiated with the excimer laser beam; forming at least one penetrating opening containing area including at least one through-hole in the plastic sheet by irradiating the excimer laser beam irradiation side thereof with the excimer laser beam; and removing the polymer film from the plastic sheet after the formation of the penetrating opening containing area. By use of a plastic mask fabricated by the above method, a paste printing is also carried out.

12 Claims, 17 Drawing Sheets

F I G. 1
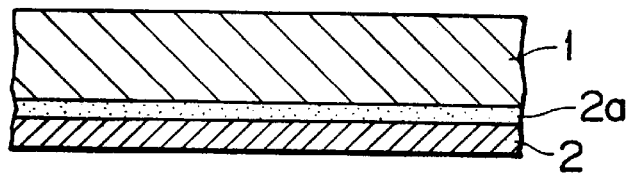
F I G. 2
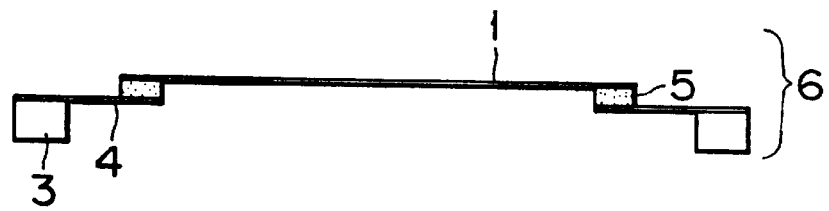
F I G. 3
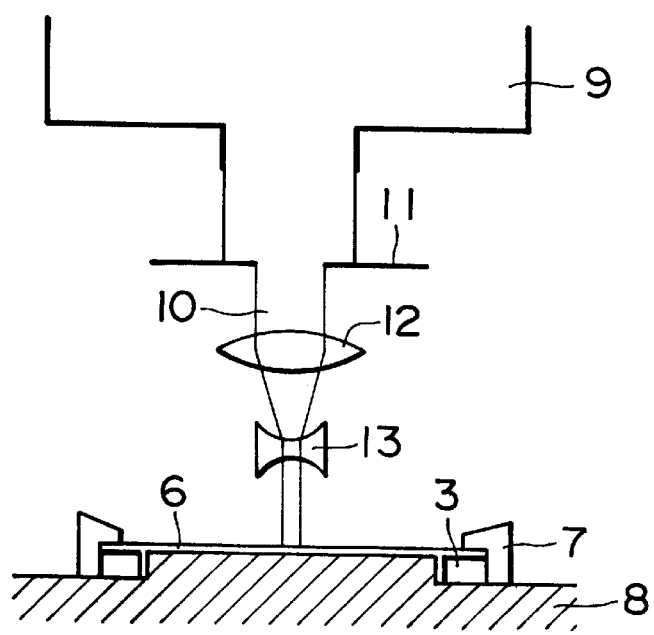

F I G. 9(a)
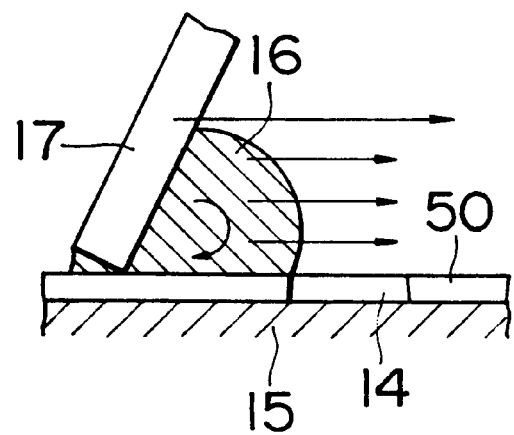
F I G. 9(b)
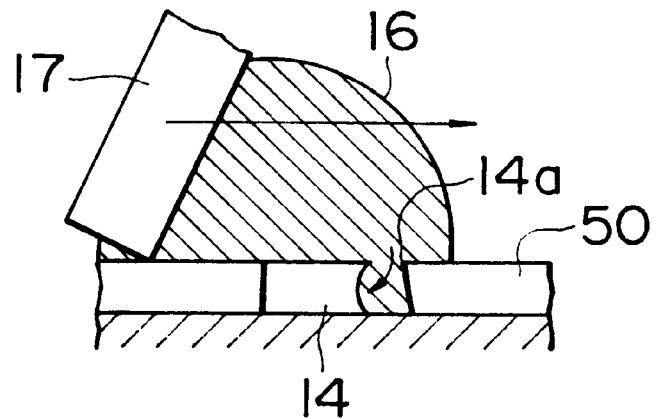
F I G. 9(c)
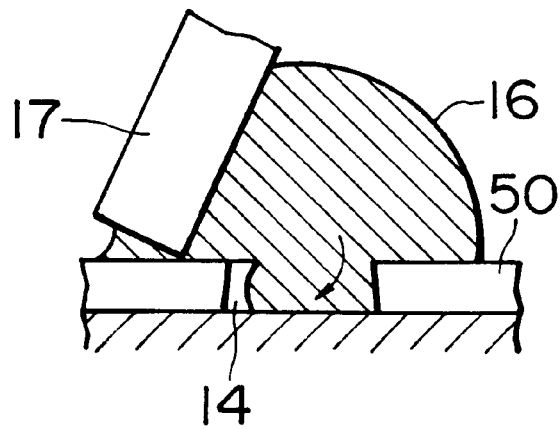

FIG. 24
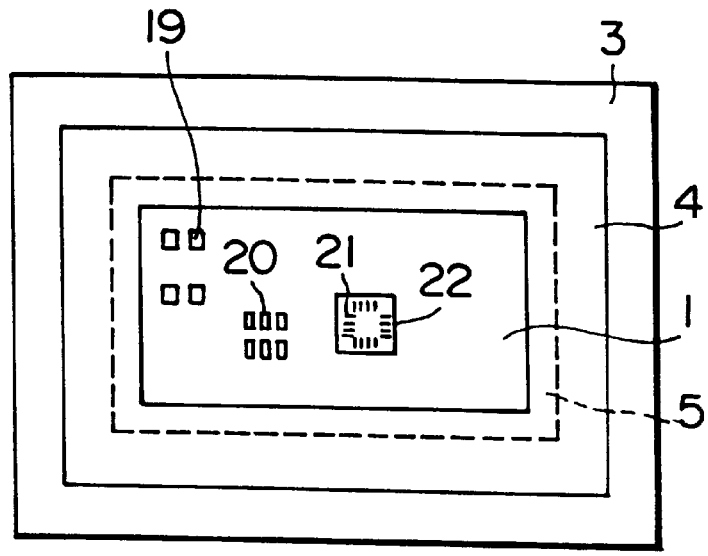
FIG. 25A
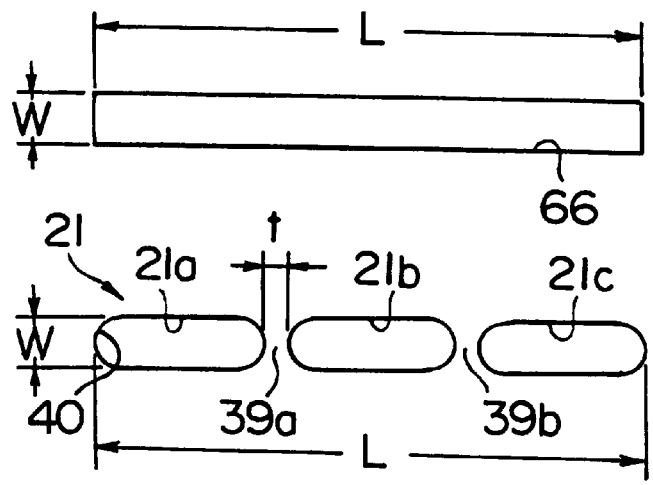
FIG. 25B

SQUEEGEE MOVING DIRECTION

METHOD OF FABRICATING PLASTIC MASK FOR PASTE PRINTING, PLASTIC MASK FOR PASTE PRINTING, AND PASTE PRINTING METHOD

This application is Division of application Ser. No. 08/579,762 filed on Dec. 28, 1995 now U.S. Pat. No. 5,887,520.

BACKGROUND OF THE INVENTION

1. Field of the Invention

The present invention relates to a method of fabricating a plastic mask for paste printing for forming patterns by use of an ink, an adhesive agent, a solder paste, or a paste-like resin (hereinafter referred to as the paste) on a printing material, more particularly to a method of fabricating a plastic mask for such paste printing, which is carried out by forming a pattern of through-holes in a plastic sheet by excimer later abrasion.

The present invention also relates to a plastic mask fabricated by the above-mentioned method, and also to a paste printing method by use of the plastic mask.

2. Discussion of Background

For forming a printed pattern on a printing material with the above-mentioned paste by use of a printing mask, the following method is generally used:

A printing mask with a pattern of through-holes is brought into close contact with a printing material, and a paste is spread on the surface of the printing mask by a squeegee so as to fill the through-holes with the paste. An excessive paste is then removed from the surface of the printing mask.

The printing mask is then separated from the printing material in such a manner that the paste passes through the through-holes and remains in the same pattern as that of the through-holes formed in the printing mask on the printing material, whereby a paste pattern corresponding to the pattern of the through-holes is printed on the surface of the printing material.

Such printing masks for use in practice can be roughly classified into screen masks and metal masks.

As screen masks, there are known, for example, punch press mask, YAG laser mask, etching mask, additive mask and half-etching mask.

The punch press mask was developed as a solder paste printing mask for fabricating electronic parts. The punch press mask can be prepared by forming round through-holes in a metal shout with a punch.

This printing mask can be easily and quickly prepared by utilizing NC data of a mounter used in a mounting process with high through-hole making speed.

This printing mask has the advantages over other printing masks that the production method is simple and therefore the printing mask can be produced at extremely low cost. Furthermore, the apparatus for producing the printing mask is also inexpensive and small-sized and therefore can be brought into and used in a printing facility without difficulty.

Despite such advantages, this printing mask has the shortcomings that upper edge portions of the through-holes tend to be rounded, and rough broken surfaces or burrs tend to be formed in the lower edge portions of the through-holes, so that the paste filled in the through-holes cannot smoothly pass through the through-holes and therefore the printing quality is poor.

A minimum diameter of the through-hole that can be formed is about 0.3 mm. For example, in the solder paste printing for fabricating electronic parts, a minimum pitch will be about 0.5 mm in QFP (quad flat package) at best.

A YAG laser mask is prepared by fusing a metal shoot (usually SUS) with YAG laser and fused portions in the metal sheet are blown off by use of an assist gas to form through-holes in the metal shoot.

In the case of the YAG laser mask, through-holes are made in accordance with the NC data or the like, no that the YAG laser mask has the advantage that the mask can be produced in a short time with a minimum dispersion in quality, but has the disadvantages that the inner walls of the through-holes are rough, and dross is deposited at the edge portions of the through-holes, so that the printing quality obtained by the YAG laser mask is slightly inferior to that obtained by other printing masks.

Furthermore, convex portions are formed in the edge portions by the deposition of the dross thereon, and the thus formed convex portions tend to make imperfect the contact of the printing mask with a printing material during the printing process. If much imperfect contact taken place, it is necessary to remove the convex portions from the edge portions by grinding or polishing the surface of the printing mask.

An etching mask is prepared as follows: A photosensitive resin is coated on both sides of a metal plate to form resist layers thereon. The resist layers are exposed to light through a photomask on which through-holes are depicted in a pattern (hereinafter referred to as the through-hole pattern depicted photomask) and are then developed by removing the portions corresponding to the through-hole pattern from the resist layers. This metal plate is then subjected to etching, whereby through-holes are made in the same pattern as the above-mentioned through-hole pattern in the metal plate. Thus, an etching mask for printing is prepared. In the thus prepared etching mask, etching is carried out on both sides of the metal plate for making the through-holes therein, so that a convex portion is formed at the central portion of the inner wall of each through-hole.

Furthermore, the inner wall of the through-hole is rough, so that a paste cannot smoothly pass through each through-hole. The result is that the printing quality obtained by the thus prepared etching mask is poor.

An additive mask is prepared as follows: A relatively thick photosensitive resin layer or dry film layer is provided on a plating substrate. The photosensitive resin layer is exposed to light through a through-hole pattern depicted photomask and developed by removing the portions in the photosensitive resin layer except the portions corresponding to the through-hole pattern. Thus, the photosensitive resin layer portions remain in the through-hole pattern on the plate substrate. A metal plate, for example, made of nickel, with an appropriate thickness, is formed by plating around the photosensitive resin layer portions which remain in the through-hole pattern. The metal plate is then removed from the plating substrate, and the photosensitive resin layer portions are dissolved away from the metal plate, whereby a metal plate with through-holes which correspond to the removed photosensitive resin layer portions is prepared as a printing mask.

The inner walls of the through-holes formed in the above metal plate are the smoother than any of the inner walls of through-holes formed in metal masks prepared by any other methods and accordingly, the printing quality obtained by the metal plate is relatively good. However, occasionally, the inner walls of the through-holes are roughened by the over-exposure of the dry film, which may be referred to an "attack phenomenon".

It is considered that the "attack phenomenon" in caused as follows. It is necessary that the photosensitive resin layer or dry film for the formation of the through-holes in the printing mask be sufficiently thicker than the additive mask. Occasionally, the thickness of the photosensitive resin layer may be 200 μm or more. Since this thickness is much greater than that of a photosensitive resin layer for the masking of an etching liquid, which is in the range of 20 to 30 μm, a sufficient amount of light must be applied so an to have the light reach the bottom portion of the photosensitive resin layer on the side of the substrate. For this reason, light with high intensity is applied to the uppermost surface of the photosensitive resin layer on the side of the photomask.

When the above-mentioned light applied to the uppermost side of the photosensitive resin layer causes halation within the photosensitive resin layer, the portions which should be shaded by the photomask are exposed to the light scattered from the adjacent portions within the photosensitive resin layer. As a result, the inner walls of the through-holes are roughened as mentioned above.

Furthermore, stepped portions are formed in the inner walls of the through-holes with the attachment of the dry film thereto while in use, whereby the printing quality is lowered.

The plated surface of the printing metal plate which comes into contact with a printing material tends to be roughened. In particular, when finely-divided particles are contained in a paste for printing, such as in a solder paste, and such a paste spreads, the finely-divided particles in the paste enter the roughened portions at the plated surface of the mask and are fixed thereon, so that the roughness of the surface is further intensified. The result is that the close contact with the printing metal plate with the printing material is hindered, and the spreading of the paste is further increased.

On the other hand, one of the most representative materials used as plating materials in the additive mask is nickel. Nickel is softer than stainless steel (usually SUS 304) which in frequently used an a material for an etching mask, so that the portions near minute through-holes are easily deformed by the convex portions in the roughened surface or by some foreign materials, whereby the printing quality tends to be easily degraded.

As a countermeasure to avoid this problem, the hardness of the additive mask is increased, for example, with the addition of cobalt thereto at the time of plating. This countermeasure, however, tends to increase the roughness of the plated surface and to promote the above-mentioned fixing of the finely-divided particles in the paste, thereby increasing the spreading of the paste.

A half-etching mask is used for printing, particularly a solder paste in printed circuit boards for electronic parts. In this field, it is required that a mixture of large and micro electronic parts be mounted in accordance with the recent tendency that electronic parts are small-sized. When solder paste printing is performed or micro electronic parts, it is required that the printing mask be made thin and that micro through-holes be formed in the printing mask and filled with the solder paste; while when solder paste printing is performed for relatively large parts, it is required that the printing mask be made thick and that relatively large through-holes be formed in the printing mask and filled with the solder paste.

When solder paste printing is performed on a printed circuit board on which large parts and micro parts are to be mixedly mounted, by use of a thin printing mask for solder printing for micro parts, the solder paste for the large parts quickly runs out; while when solder paste printing is performed on the printed circuit board by use of a thick printing mask for solder printing for large parts, the colder paste does not smoothly pass through the micro through-holes for the micro parts, and even if the solder paste passes through the micro through-holes, excellent paste printing cannot be performed due to the presence of excessive solder paste.

It is the half-etching mask that can solve the above-mentioned problems since it in partially made thin by etching and paste printing for large parts and that for micro parts can be performed by use of one and the same printing mask.

The half-etching mask is prepared as follows: First of all, in accordance with the previously mentioned method for preparing the additive mask, there is prepared a printing mask with a necessary thickness for large parts, micro through-holes for micro parts, and relatively large through-holes for large parts.

The micro through-holes within a half-etching area are filled with a resin for protecting inner walls of the micro through-holes.

The area except the half etching area, for which etching is unnecessary, is masked by use of a resist agent, and then etching is performed until the thickness of the etched area reaches a suitable thickness for the micro parts, whereby a thin printing mask in prepared only in the area where micro through-holes for micro parts are formed.

Such a half-etching mask has made it possible to perform solder paste printing for large, normal, and micro electronic parts by use of one and the same printing mask in the field of electronic part mounting. On the other hand, even if the micro through-holes are filled with the resin for protecting the inner walls thereof, the spreading of the etching liquid cannot be completely prevented, so that the smooth inner walls made by the additive method are roughened by the spread etching liquid. The result in that the half-etching mask tends to have the shortcoming that the micro through-holes for most precise printing are most roughened and accordingly the printing quality is lowered.

Furthermore, the above-mentioned process for preparing the half-etching mask includes the stop of carrying out the additive method, so that the previously mentioned shortcomings of the additive method may also appear in the above-mentioned process. Namely, the additive method has the shortcomings that the inner walls of the through-holes are roughened by the over-exposure of the dry film, or stopped portions are formed in the inner walls of the through-holes with the attachment of the dry film thereto while in use, whereby the printing quality is lowered.

Furthermore, the above-mentioned metal masks, such as punch press mask, YAG laser mask and etching mask, lack flexibility, so that when a printing material has convex portions on the surface thereof, even if it is tried to bring such a printing mask into close contact with the printing material, there are formed gaps between the printing mask and the printing material. Therefore, when the through-holes in the printing mask are filled with a paste, the paste enters the gaps between the printing mask and the printing material, so that the printed paste pattern improperly spreads. Furthermore, when a paste containing solid particles is employed, the solid particles adhere to the back side of the mask, and during the repeated printing by use of the mask, the adhering solid particles make a gap between the printing mask and the printing material, so that the improper spreading of the printed paste pattern is further increased.

Metal sheets (mainly a nickel sheet), such as the additive mask and the half-etching mask, which are prepared by plating, are flexible, so that when such a metal sheet is brought into close contact with a printing material, even if there are foreign materials or convex portions on the surface of the printing material, the mask can be easily deformed so as to be in close contact therewith. Therefore, when a portion near the through-holes of the mask in deformed and the mask is repeatedly used for printing, the paste enters behind the mask from the deformed portion thereof, The result is that the printed paste patterns spread and the printing quality is lowered.

Furthermore, the thicker the plated layer, the rougher the surface of the plated layer. In particular, when the paste contains solid particles which can be easily deformed, such an solder particles, such solid particles enter between the mask and the printing material and are depressed therebetween. The depressed solid particles adhere to the rough surface of the mask. when such a printing mask in repeatedly used for printing, the adhering solid particles form gaps between the printing mask and the printing material. When the through-holes of the mask are filled with a paste, the paste enters the gaps between the printing mask and the printing material, so that the printed paste pattern spreads.

When the adhering solid particles overflow out of the through-holes, the paste does not easily pass through the through-holes, so that the printing quality of the paste is degraded.

In the case where a paste enters the gap between a printing mask and a printing material, and the paste or solid particles contained in the paste adhere to the back side of the printing mask, it in required to wipe off the paste which adheres to the back side of the printing mask or to clean the back side of the printing mask quite often, especially when the printing mask is used repeatedly.

In accordance with the recent trend that electronic appliances and parts are made smaller and smaller in size, demands for highly precise paste printing of micro patterns with high quality free from non-printing portions or chips and spreading, are increasing in the field of the application of paste printing to electronic appliances and the like.

In order to solve the previously mentioned various problems of the conventional metal masks and to perform precise paste printing with high quality, thereby meeting the above-mentioned demands, the inventor of the present invention has prepared a plastic mask for paste printing by forming through-holes in a predetermined pattern in a plastic sheet by excimer laser abrasion, and has conducted paste printing by use of the plastic mask prepared by excimer laser abrasion. As a result, it has been discovered that the previously mentioned various problems of the conventional metal masks can be solved by the plastic mask.

Through-holes can be formed in a plastic sheet by excimer laser abrasion, so that the through-holes formed in the plastic sheet are free from burrs in the edges and deposition of dross as in the through-holes in the conventional metal masks, and also free from non-clear-cut edges an in the through-holes formed in the conventional punch press mask.

Furthermore, the inner walls of the through-holes formed in the plastic mask are extremely smooth and the formed through-holes themselves are precise and clean.

In a conventional metal mask made of stainless steel (usually SUS304), the surface of the metal mask is subjected to hair-line finishing or crape finishing. Further, in the case where the metal mask is made of an electro-forming nickel, the surface of the metal mask in rough. In such a case, it may occur that fine particles, for example, solder particles, contained in a solder paste which is spread onto the back side of the mask, are depressed between the mask and a printing material, so that the depressed particles are fixed to the rough surf ace of the metal mask. This is apt to occur at the convex portions in the printing surface of the mask where the paste tends to spread. When this takes place, the contact of the mask with the printing material becomes imperfect, so that the spreading of the paste is increased.

In contrast to this, in the case of the plastic mask, the surface thereof can be easily made extremely smooth, so that the fine particles contained in the paste are hardly fixed to the surface of the plastic mask. This significant feature of the plastic mask makes it possible to attain (a) close contact of the mask with a printing material, (b) significant reduction of the spreading of the paste, and (c) improvement of continuous printing performance.

Further, by use of the plastic mask, a so-called "half-etching mask" can be easily prepared, in which a portion of the plastic sheet on the side with which a squeegee comes into contact 1a partially made thin, and a predetermined pattern of through-holes for micro parts is formed in the partially thinned portion.

The plastic mask in softer and more flexible than the metal masks and therefore can flexibly follow any convex and concave portions on a printing surface to attain close contact therewith without any gap or with a minimum gap between the mask and the printing surface.

Furthermore, since the plastic mask is flexible, when it is peeled away from the printing surface, the plastic mask can immediately return to its original flat shape. In other words, in the plastic mask, there occurs no deformation as in a metal mask such as a nickel sheet formed by plating, when the mask is brought into close contact with a printing surface with convex and concave portions thereon.

Therefore, by performing paste printing by use of the plastic mask, the through-holes in the plastic mask can be completely filled with the paste, and when the plastic mask is removed from the printing material, the filled paste can pass through each through-hole in a complete shape, and the formation of gaps between the plastic mask and the printing surface can be minimized, so that on the printing surface, there can be formed a paste pattern which accurately corresponds to the pattern of the through-holes formed in the mask and is free from any spreading of the paste, whereby highly precise, high quality paste printing can be performed.

However, there are the following problems in the production of the plastic mask and also in the paste printing by use-of the plastic mask:

(1) The plastic mask is usually prepared by placing a plastic sheet on a working table, then bringing the plastic sheet into close contact with the surface of the working table, and forming through-holes in the plastic sheet with the irradiation with an excimer laser beam from above the plastic sheet. In this method, however, in a portion of the plastic sheet with which the working table is not sufficiently in close contact, occasionally, there occurs that a plastic thin film remains at the bottom of through-holes made in the plastic sheet, which is hereinafter referred to as the "thin-film remaining phenomenon"; and in a portion of the plastic sheet with which the working table is completely in close contact, there occurs that the lower edges of the formed through-holes are rounded, which is hereinafter referred to as the "edge-rounding phenomenon".

When a through-hole is made in the plastic sheet by excimer laser, the through-hole is usually tapered with the opening of the through-hole becoming narrower in the direction from the upper opening to the lower opening thereof.

When paste printing is performed in practice by use of a plastic mask with such through-holes, the plastic mask is reversed upside down in such a manner that the narrower opening of the through-hole comes to the upper side and the larger opening of the through-hole comes to the lower side.

When the "thin-film remaining phenomenon" taken place, the presence of the remaining thin film at the upper end portion of the hole hinders the filling of the hole with the paste and the passing of the paste through the hole, thereby making it impossible to perform paste printing with high quality and high precision.

Furthermore, when the "edge-rounding phenomenon" takes place, the rounded edge of the upper opening of the through-hole hinders the filling of the through-hole with the paste and the passing of the paste through the through-hole, thereby making it impossible to perform paste printing with high quality and high precision.

(2) The plastic mask is made of an insulating material and is softer than a metal, and therefore has problems due to the generation of electrostatic charges by the friction between the plastic mask and a squeegee during paste printing, and also due to abrasion resistance, which problems are not found in the metal masks:

As shown in FIGS. 32 and 33, when paste printing is performed, a paste 16 is spread on the surface of a plastic mask 50 by a squeegee 27, so that the through-holes 19, 20 and 21 arranged in a pattern in the plastic mask 50 are filled with the paste 16. As the squeegee 27, a soft and elastic squeegee made of, for example, urethane resin, is usually employed in order that the squeegee 27 can come into close contact with the surface of a thin half-etching portion 22 of the plastic mask 50, or in order that the squeegee 27 can come into close contact with the plastic mask 50 even if a printing material includes convex and concave portions at the surface thereof, or a curved surface. A squeegee made of urethane resin is an electrically insulating material.

Therefore, when friction is caused between the urethane squeegee and the surface of the plastic mask 50 during paste printing, the surface of the urethane squeegee and that of the plastic mask 50 are charged by the electrostatic charges generated at the respective surfaces thereof.

In the came of metal masks, since the metal masks themselves are electroconductive, there are almost no problems concerning the electrostatic charging. In contrast to this, in the case of the plastic mask, since the plastic mask itself is electrically insulating, problems caused by the electrostatic charging are unavoidable. In particular, serious problems such as electrostatic destruction of inner circuits are caused during actual operations for mounting electronic parts on printed circuit boards by duplex reflow soldering.

Duplex reflow soldering is performed as follows: A solder paste is printed on one side of a printed circuit board. Electronic parts are then mounted thereon by utilizing the viscosity of the solder paste. The electronic-parts-mounted printed circuit board is then passed through an electric furnace called "reflow furnace", whereby the solder paste is fused and the electronic parts are soldered on one side of the printed circuit board. This printed circuit board is turned upside down, and the above-mentioned soldering process is repeated on the opposite side of the printed circuit board, whereby electronic parts are soldered on both sides of the printed circuit board.

When the plastic mask is used in solder paste printing in the above-mentioned duplex reflow soldering, the following problems are caused:

Electrostatic charges generated by the use of the plastic mask are built up to reach a high potential in the plastic mask as triboelectric charging is repeated by the printing process. The thus built-up electrostatic charges flow into the electronic parts which are already mounted on one side of the print-circuit board, and when the electric charges reach a certain potential, there is the risk that micro circuits within the electronic parts are subjected to electrostatic destruction.

Some electronic parts which are soldered by the above-mentioned duplex reflow soldering are extremely vulnerable to electrostatic charges. For example, ROM, RAM, CMOS products and CCD are known as being apt to be subjected to electrostatic destruction by electrostatic charges of one hundred and several tens volts.

When a solder paste is printed on a glass epoxy substrate by use of a plastic mask without antistatic treatment and a urethane squeegee, the voltage of electrostatic charges built on the surface of the plastic mask actually exceeds as high as 1000 volts during 3 to 4 times printing operations. There is the risk that the previously mentioned electronic parts may be subjected to electrostatic destruction by the electrostatic charges with the above-mentioned high voltage.

Furthermore, with respect to the electronic parts which are electrostatically destroyed, the occurrence of the problems cannot be recognized from the external appearance thereof, and the problems are discovered during function inspection which is almost the final stop of the mounting of the electronic parts, so that an anormous loss is incurred when the discovery of such problems is delayed.

The electrostatic destruction within the memory circuits such as ROM and RAM cannot be discovered by normal function inspection, so that there is the risk that inferior products may be put on the market.

As a countermeasure for avoiding the above-mentioned problems caused by electrostatic charging, the use of a squeegee made of a metal may be considered. To be more specifically, an the squeegee, a metal plate made of phosphor bronze may be used in an attempt to dissipate the electrostatic charges built on the surface of the plastic mask through such an electroconductive metal squeegee.

However, as shown in FIG. 34, a metal squeegee 67 is not as flexible as a urethane squeegee, so that when printing in performed at the half-etching portion 22 which is thinner than the other portion 51, the lower end portion of the metal squeegee 67 above the half-etching portion 22 passes over the thinner half-etching portion 22 without coming into close contact with the half-etching portion 22, since the other lower end portion of the metal squeegee 67 is supported on the other portion 51 which is thicker than the half-etching portion 22, so that a thin film of the solder paste 16 remains on the half-etching portion 22.

An a result, when the plastic mask 50 is peeled away from the printing surface, a thin film of the solder paste 16 remains on the half-etching portion 22 and hinders the passing of the solider paste 16 from the micro through-holes formed in the half-etching portion 22 as illustrated in FIG. 35. Therefore, the metal squeegee is not suitable for paste printing by use of a plastic mask including a half-etching portion, so that there is no choice but to use a plastic squeegee such as a urethane squeegee, and in such a case, the previously mentioned problems are caused by the triboelectric charging of the plastic squeegee.

Furthermore, since the plastic mask is softer than the metal masks, the plastic mask is inferior to the metal masks with respect to the abrasion resistance. In particular, when the printing material is a material having a rough surface, such as a ceramic plat and a glass epoxy layered substrate, or when hard and fine chips of the material for the substrate are present at the surface of the substrate, the abrasion of the plastic mask proceeds further quickly.

(3) A soft and elastic squeegee, such as a squeegee made of urethane resin, is usually used in order to bring the squeegee into close contact with the thin half-etching portion 22, since the paste 16 is spread on the surface of the plastic mask 50 as illustrated in FIGS. 32 and 33.

Further as shown in FIG. 32, various sized through-holes, such as a large through-hole 19 and a medium through-hole 20 and a micro through-hole 21, are formed in the plastic mask 50 in such arrangement that corresponds to the arrangement of the connection terminals of electronic parts to be soldered. As illustrated in FIG. 36, when such through-holes are slit-shaped through-holes 41 which are formed side by side with a narrow rib 38 between each slit-shaped through-hole 41, and a urethane squeegee 27 passes over the slit-shaped through-holes 41 in contact therewith as illustrated in FIG. 37, the urethane squeegee 27 proceeds as the tip of the elastic urethane squeegee 27 slightly enters each of the slit-shaped through-holes 41 and catches each narrow rib 38, so that each rib 38 is bent as illustrated in FIG. 38. This is particularly apt to occur in small slit-shaped through-holes formed in a half-etching portion. This occurs more easily when the edge of the squeegee in directed so as to be in agreement with the longer side of the slit-shaped through-holes, in such a manner that the squeegee 27 is moved in the direction of the arrow an illustrated in FIG. 38.

When printing is performed as the ribs 38 are successively bent, the amount of the paste to be printed and the printing positions cannot be controlled properly. In the worst case, printing is carried out in such a manner that the adjacent slit-shaped through-holes are connected. Furthermore, if the banding of the ribs is repeated as the printing is performed, the base portions of each rib may be broken because of the fatigue thereof.

SUMMARY OF THE INVENTION

It is therefore a first object of the present invention to provide a method of fabricating a plastic mask which is capable of performing paste printing with high quality and high precision by forming precise and fine through-holes in a plastic sheet, which are free from the "thin-film remaining phenomenon", the "edge-rounding phenomenon" and burrs in the through-holes, or in which the "thin-film remaining phenamenon", the "edge-rounding phenomenon" and burrs in the through-holes are minimized, and therefore have excellent paste passing performance A second object of the present invention in to provide the above-mentioned plastic mask.

A third object of the present invention is to provide a paste printing method capable of performing paste printing a precise through-hole pattern with high quality and high precision by use of the above-mentioned plastic mask.

A fourth object of the present invention is to provide a plastic mask with excellent antistatic performance and excellent abrasion resistance, and to provide a paste printing method by use of this plastic mask.

A fifth object of the present invention is to provide a plastic mask with slit-shaped through-holes with the bending of the ribs for the through-holes being minimized, thereby preventing improper printing and the breaking of the bass portions of the ribs due to the fatigue thereof which may be caused by the repeated banding of the ribs, and to provide a paste printing method by use of the above plastic mask.

The above objects of the present invention can be achieved by the following plastic mask fabricating methods, plastic masks, paste printing methods and plastic masks therefor:

A method of fabricating a plastic mask for paste printing of the present invention is a plastic mask fabricating method with a plastic sheet being irradiated with an excimer laser beam for forming at least one penetrating opening containing area comprising at least one through-hole in the plastic sheet, comprising the steps of (1) bringing a polymer film capable of absorbing at least part of the excimer laser beam into close contact with a back surface of the plastic sheet which in opposite to an excimer laser beam irradiation side thereof which is to be irradiated with the excimer laser beam; (2) forming at least one penetrating opening containing area comprising at least one through-hole in the plastic sheet by irradiating, the excimer laser beam irradiation side thereof with the excimer laser beam; and (3) removing the polymer film from the plastic sheet after the formation of the penetrating opening containing area.

In the above-mentioned plastic mask fabrication method, the polymer film may be releasably stuck on the back surface of the plastic sheet opposite to the excimer laser beam irradiation side thereof.

A plastic mask for pants printing of the present invention comprises a plastic sheet comprising at least one penetrating opening containing area which comprises at least one through-hole therein, the penetrating opening containing area being formed by the plastic sheet being irradiated with an excimer lamer beam, with the depth of each of the through-holes in the penetrating opening containing area measured from the top surface of the plastic mask to the narrowest portion of each of the through-holes in the penetrating opening containing area being 10 $\mu$m or less.

The above-mentioned plastic mask of the present invention may have a thickness of 10 to 500 $\mu$m and a modulus of bending elasticity of 20 to 500 Kgf·mm$^{-2}$.

A paste printing method of the present invention comprises the steps of (1) bringing a paste printing mask comprising at least one penetrating opening containing area which comprises at least one through-hole into close contact with a printing material; (2) filling each of the through-holes in the penetrating opening containing area with a paste comprising solid particles by spreading and pressing the paste on the paste printing mask; and (3) removing the paste printing mask from the printing material, thereby forming on the printing material a paste pattern in the same pattern as that of the through-holes in the penetrating opening containing area, wherein as the paste printing mask, there is employed a plastic mask for paste printing provided with a penetrating opening containing area, the penetrating opening containing area being formed in a plastic sheet so as to include at least one through-hole by excimer laser beam abrasion, with the depth of each of the through-holes of the penetrating opening containing area measured from the top surface of the plastic mask to the narrowest portion of each of the through-holes in the penetrating opening containing area being ½ or less the particle size of the solid particles contained in the paste.

In the above-mentioned paste printing method, the plastic mask for paste printing may have a thickness of 10 to 500 $\mu$m and a modulus of bending elasticity of 20 to 500 Kgf·mm$^{-2}$.

A plastic mask for paste printing of the present invention comprises a plastic sheet with a penetrating opening containing area comprising at least one through-hole; and an electroconductive layer formed on at least one of the opposite upper and lower surfaces of the plastic sheet.

In the above-mentioned plastic mask, the electroconductive layer may be provided on one of the opposite surfaces of the plastic sheer with which surface a printing material is to come into contact.

Further, in the above-mentioned plastic mask, the electroconductive layer may be provided on each of both upper and lower surfaces of the plastic sheet in such a manner that the two electroconductive layers are electrically connected with each other.

In the above-mentioned plastic mask, the two electroconductive layers may be electrically connected with each other through an electroconductive adhesive agent.

Furthermore, in the above-mentioned plastic mask, the electroconductive layer may be an abrasion resistant electroconductive layer.

Furthermore, in the above plastic mask, as the electroconductive layer, any of chromium, nickel, aluminum, stainless steel and titanium coating electroconductive layers may be employed. Of these coating electroconductive layers, a titanium electroconductive layer is preferable in the present invention.

A paste printing method of the present invention comprises the steps of (1) bringing a paste printing mask provided with a penetrating opening containing area comprising at least one through-hole formed in a predetermined pattern into close contact with a printing material; (2) filling each of the through-holes in the penetrating opening containing area with a paste by spreading and pressing the paste on the paste printing mask, and (3) removing the paste printing mask from the printing material, thereby forming on the printing material a paste pattern in the same pattern as that of the penetrating opening containing area, wherein as the paste printing mask, there in employed a plastic mask for paste printing which comprises (a) a plastic sheet with a penetrating opening containing area comprising at least one through-hole in a predetermined pattern, and (b) an electroconductive layer which is formed on at least one of the opposite upper and lower surfaces of the plastic sheet and electrically grounded.

In the above paste printing method, the electroconductive layer may be provided on only the surface of the plastic sheet with which a printing material is to come into contact.

Further, the electroconductive layer may be provided on each of both upper and lower sides of the plastic sheet in such a manner that the two electroconductive layers are electrically connected with each other.

The above-mentioned two electroconductive layers may be electrically connected with each other through an electroconductive adhesive agent.

In the above paste printing method, the electroconductive layer may be an abrasion resistant electroconductive layer.

Furthermore, in the above paste printing method, each of the electroconductive layers may be an abrasion resistant electroconductive layer.

Furthermore, in the above paste printing method, as the electroconductive layer of the printing mask, chromium, nickel, aluminum, stainless steel and titanium coating electroconductive layers may be employed. Of these coating electroconductive layers, a titanium electroconductive layer is preferable in the present invention.

A plastic mask of the present invention comprises a plastic sheet comprising at least one penetrating opening containing area comprising a plurality of slit-shaped through-holes which are formed in a head-to-tail arrangement with a joint reinforcement portion between each of the slit-shaped through-holes in the head-to-tail arrangement, in a plurality of rows with the longer side of each of the slit-shaped through-holes being positioned side by side.

In the above plastic mask, the opposite and portions of each of the slit-shaped through-holes portions are preferably rounded, and the rows of the slit-shaped through-holes may be arranged in parallel to each other, and the joint reinforcement portions are preferably disposed in line at a predetermined angle with respect to the parallel rows of the slit-shaped through-holes.

A paste printing method of the present invention comprises the steps of (1) bringing a paste printing mask comprising a penetrating opening containing area which comprises a plurality of slit-shaped through-holes formed in a predetermined pattern into close contact with a printing material; (2) filling each of the through-holes in the penetrating opening containing area with a paste by spreading and pressing the paste on the paste printing mask, and (3) removing the paste printing mask from the printing material, thereby forming on the printing material a paste pattern in the same pattern as that of the slit-shaped through-holes in the penetrating opening containing area, wherein as the paste printing mask there is employed a plastic sheet comprising at least one penetrating opening containing area comprising a plurality of slit-shaped through-holes which are formed in a head-to-tail arrangement with a joint reinforcement portion between each of the slit-shaped through-holes in the head-to-tail arrangement in a plurality of rows with the longer side of each of the slit-shaped through-holes being positioned side by side.

In the above paste printing method, the edges of each of the slit-shaped through-holes are preferably rounded.

Furthermore, in the above paste printing method, it is preferable that the joint reinforcement portions be arranged in line at a predetermined angle with respect to each row of the slit-shaped through-holes.

BRIEF DESCRIPTION OF THE DRAWINGS

A more complete appreciation of the invention and many of the attendant advantages thereof will be readily obtained as the same becomes better understood by reference to the following detailed description when considered in connection with the accompanying drawings, wherein:

FIG. 1 is a schematic cross-sectional view of a plastic sheet for use in a plastic mask fabrication method of the present invention.

FIG. 2 is a schematic cross-sectional view of an example of a plastic sheet body mounted before the excimer laser abrasion thereof.

FIG. 3 is a schematic cross-sectional view of a plastic sheet which is abraded by an excimer laser abrasion apparatus.

FIGS. 9(a), 9(a) and 9(c) schematically show the steps of the filling of a through-hole free from a non-clear-cut edge in a fine pattern of through-holes with a paste in a plastic fabrication method of the present invention.

FIG. 24 is a plan view of the first example of the plastic mask comprising through-holes provided with reinforcement portions, showing the entire structure thereof.

FIGS. 25(a) and (b) are diagrams of the formation of the reinforcement portions for the through-holes in the plastic mask in FIG. 24.

DESCRIPTION OF THE PREFERRED EMBODIMENTS

Figure 4A:
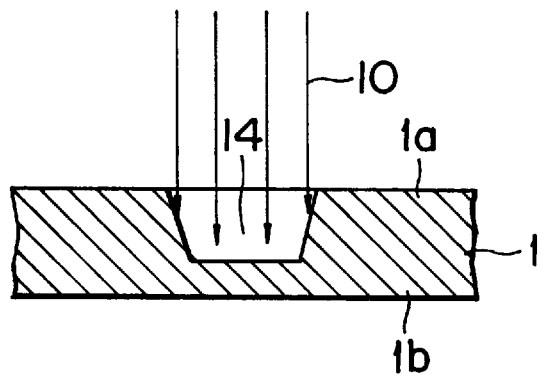
FIGS. 4(a), 4(b) and 4(c) are schematic cross-sectional views of a through-hole during the formation thereof in a plastic sheet, showing a mechanism for the formation of a remaining thin film in the through-hole during the fabrication of a plastic mask.

As mentioned previously, a method of fabricating a plastic mask for paste printing of the present invention in a plastic mask fabricating method with a plastic sheet being irradiated with an excimer laser beam for forming at least one penetrating opening containing area comprising at least one through-hole in the plastic sheet, comprising the steps of (1) bringing a polymer film capable of absorbing at least part of the excimer laser beam into close contact with a back surface of the plastic sheet which is opposite to an excimer laser beam irradiation side thereof which is to be irradiated with the excimer laser beam; (2) forming at least one penetrating opening containing area comprising at least one through-hole in the plastic sheet by irradiating the excimer laser beam irradiation side thereof with the excimer laser beam; and (3) removing the polymer film from the plastic sheet after the formation of the penetrating opening containing area.

According to the above plastic mask fabrication method, since the polymer film is in close contact with the back surface of the plastic sheet which in opposite to the excimer laser beam irradiation side thereof, a thin film which may remain at the bottom of each through-hole to be made by excimer laser cannot come to the back side of the plastic sheet, so that the thin film, if any, is irradiated with excimer laser beams, until the through-hole is completely made, and eventually no thin film remains.

Even if a thin film remains at the bottom of the through-hole for some reason, the thin film is removed when the polymer film is peeled away from the plastic sheet.

Furthermore, after the formation of the through-holes, the excimer laser beam passes through the polymer film which absorbs part of the laser beam, and therefore is attenuated, but reaches the working table. Part of the laser beam is reflected by the surface of the working table. The reflected excimer laser beam is again absorbed by the polymer film and attenuated, so that the lower edge portions of the through-holes near the working table are no longer abraded by the reflected excimer laser beam and therefore, the formation of the through-holes with non-clear-cut edges can be effectively prevented.

As mentioned previously, the presence of the remaining thin film at the bottom of the through-holes and the through-holes with non-clear-cut edges cause improper filling of the paste and unsmooth passing of the paste through the through-holes, when paste printing is performed by use of a squeegee which comes into contact with the plastic mask. However, by disposing the polymer film in close contact with the back surface of the plastic sheet, the formation of the through-holes, and the paste-filling performance and paste-passing performance thereof can be significantly improved.

In the above-mentioned plastic mask fabrication method, the polymer film may be releasably stuck on the back surface of the plastic sheet opposite to the excimer laser beam irradiation side thereof. When the polymer film is releasably stuck on the back side of the plastic sheet, the close contact of the polymer film with the plastic sheet, and the removal of the polymer film from the plastic sheet can be easily performed.

Another plastic mask for paste printing of the present invention comprises a plastic sheet comprising at least one penetrating opening containing area which comprises at least one through-hole therein, the penetrating opening containing area being formed by the plastic sheet being irradiated with an excimer laser beam, with the depth of each of the through-holes of the penetrating opening containing area measured from the top surface of the plastic mask to the narrowest portion of each of the through-hole. In the penetrating opening containing area being 10 $\mu$m or less.

No remaining thin films are formed during the fabrication of this plastic mask, and since the depth of each of the through-holes measured from the top surface of the plastic mask to the narrowest portion of each of the through-holes is 10 $\mu$m or less, when paste printing is performed by use of this plastic mask with a paste which contains solder solid particles, for example, solder solid particles mostly with a minimum diameter of 20 $\mu$m in a solder paste, the paste spread on the surface of the plastic mask can be sharply scraped off the uppermost level of each through-hole, and the through-holes are completely filled with the paste, so that high quality paste printing with high precision can be performed without improper spreading or non-printing portions in the same through-hole pattern in the penetrating opening containing area of the plastic mask.

The above-mentioned plastic mask of the present invention may have a thickness of 10 to 500 $\mu$m and a modulus of bending elasticity of 20 to 500 Xgf·mm$^{-2}$.

When paste printing is performed by use of this plastic mask, in particular, when the paste is spread on the plastic mask with the plastic mask being brought into close contact with a printing material by a squeegee which applies pressure to the upper surface of the plastic mask downward, even if the printing material has convex portions on the surface thereof, the gaps between the plastic mask and the printing material can be eliminated or minimized, whereby the paste can be prevented from entering the gaps between the plastic mask and the printing material when the through-holes are filled with the paste. As a result, improper spreading of the printed paste pattern can be prevented or minimized. Furthermore, the smearing of the back side of the plastic mask with the spread paste can be minimized and the paste printing can be repeated a greater number of times than by the conventional metal masks, without wiping the paste off the back side of the plastic mask or cleaning the back side of the plastic mask.

A paste printing method of the present invention comprises the steps of (1) bringing a paste printing mask comprising at least one penetrating opening containing area which comprises at least one through-hole into close contact with a printing material; (2) filling each of the through-holes in the penetrating opening containing area with a paste comprising solid particles by spreading and pressing the paste on the paste printing mask; and (3) removing the paste printing mask from the printing material, thereby forming on the printing material a paste pattern in the same pattern as that of the through-holes in the penetrating opening containing area, wherein as the paste printing mask, there is employed a plastic mask for paste printing provided with a penetrating opening containing area, the penetrating opening containing area being formed in a plastic sheet so as to include at least one through-hole produced by excimer laser beam abrasion, with the depth of each of the through-holes of the penetrating opening containing area measured from the top surface of the plastic mask to the narrowest portion of each of the through-holes in the penetrating opening containing area being ½ or less the particle size of the solid particles contained in the paste.

According to this paste printing method of the present invention, the depth of each of the through-holes measured from the top surface of the plastic mask to the narrowest portion of each of the through-holes being ½ or less the particle size of the solid particles contained in the paste, so that the paste can be smoothly spread onto the surface of the plastic mask and sharply scraped off the uppermost level of each through-hole, and the lower portion of the spread paste is easily scraped off by the upper end portions of the through-holes in the front and the through-holes can be completely filled with the scraped paste and the filled paste can smoothly pass through the through-holes, so that high quality paste printing with high precision can be performed in the same through-hole pattern in the penetrating opening containing area of the plastic mask.

In the above-mentioned paste printing method, the plastic mask for paste printing may have a thickness of 10 to 500 $\mu$m and a modulus of banding elasticity of 20 to 500 Kgf·mm$^{-2}$.

Because of the above-mentioned combined conditions for the thickness and modulus of bending elasticity of the plastic mask, when paste printing is performed by use of this plastic mask, in particular, when the paste is spread on the plastic mask with the plastic mask being brought into close contact with a printing material by a squeegee which applies pressure to the upper surface of the plastic mask downward, even if the printing material has convex portions on the surface thereof, the gaps between the plastic mask and the printing material can be eliminated or minimized, whereby the paste can be prevented from entering the gaps between the plastic mask and the printing material when the through-holes are flled with the paste. As a result, improper spreading of the printed paste pattern can be prevented or minimized. Furthermore, the smearing of the back side of the plastic mask with the spread paste can be minimized and the paste printing can be repeated a greater number of times than by the conventional metal masks, without wiping the paste off the back side of the plastic mask or cleaning the back side of the plastic mask.

A further plastic mask for paste printing of the present invention comprises a plastic sheet with a penetrating opening containing area comprising at least one through-hole; and an electroconductive layer formed on at least one of the opposite upper and lower surfaces of the plastic sheet.

In the above plastic mask, since the electroconductive layer is provided on at least one of the opposite surfaces of the plastic mask, the electric charges generated by the friction between a plastic squeegee such as a urethane squeegee and the surface of the plastic mask are grounded through the electroconductive layer and dissipate. Therefore, it never occurs that electric charges are built up on the surface of the plastic mask. Therefore, there is not the risk that mounted electronic parts are subjected to electrostatic destruction by the electric charges. Therefore, precise and high quality paste printing can be performed for electronic parts and boards which are vulnerable to electrostatic charges by making best use of the advantages of the plastic mask.

Furthermore, by the provision of the electroconductive layer on the plastic sheet, the abrasion resistance of the plastic sheet can be improved, so that the life of the plastic mask can be significantly extended.

In the above-mentioned plastic mask, the electroconductive layer may be provided on only one of the opposite surfaces of the plastic sheet with which surface a printing material is to come into contact.

In this plastic mask, the electroconductive layer is provided on only the surface of the plastic shoot with which surface a printing material is to come into contact, so that paste printing can be performed by use of an electroconductive paste, with the electroconductive layer of the plastic mask being grounded, whereby the electrostatic charges generated on the surface of the plastic mask during paste printing can be caused to dissipate to the lower electroconductive layer through the electroconductive paste.

Further, in the above-mentioned plastic mask, the electroconductive layer may be provided on each of both upper and lower surfaces of the plastic sheet in such a manner that the two electroconductive layers are electrically connected with each other.

In this plastic mask, since the electroconductive layer is provided on both sides of the plastic sheet in such a manner that the two electroconductive layers are electrically connected with each other, paste printing can be performed with the lower electroconductive layer of the plastic mask being grounded, so that the electrostatic charges generated on the plastic mask can be led to the lower electroconductive layer through the upper electroconductive layer. Therefore, even when paste printing is performed by use of an insulating paste, the electrostatic charges can be caused to dissipate. As a matter of course, an electroconductive paste can also be employed.

In the above-mentioned plastic mask, the two electroconductive layers may be electrically connected with each other through an electroconductive adhesive agent.

In this plastic mask, since the structure thereof can be more simplified since the two electroconductive layers are electrically connected with each other through an electroconductive adhesive agent.

Furthermore, in the above-mentioned plastic mask, the electroconductive layer may be an abrasion resistant electroconductive layer, and as the electroconductive layer, any of chromium, nickel, aluminum, stainless steel and titanium coating electroconductive layers can be employed, although of such coating electroconductive layers, a titanium electroconductive layer is preferable in the present invention.

In this plastic mask, since the electroconductive layer is abrasion resistant, the life of the plastic mask can be prolonged.

A further paste printing method of the present invention comprises the steps of (1) bringing a paste printing mask provided with a penetrating opening containing area comprising at least one through-hole formed in a predetermined pattern into close contact with a printing material; (2) filing each of the through-holes in the penetrating opening containing area with a paste by spreading and pressing the paste on the paste printing mask, and (3) removing the paste printing mask from the printing material, thereby forming on the printing material a paste pattern in the same pattern as that of the penetrating opening containing area, wherein as the paste printing mask, there is employed a plastic mask for paste printing, which comprises (a) a plastic sheet with a penetrating opening containing area comprising at least one through-hole in a predetermined pattern, and (b) an electroconductive layer which is formed on at least one of the opposite upper and lower surfaces of the plastic sheet and electrically grounded.

In the above paste printing method, the electroconductive layer may be provided on only the surface of the plastic sheet with which a printing material is to come into contact.

Further, the electroconductive layer may be provided on each of both upper and lower sides of the plastic sheet in such a manner that the two electroconductive layers are electrically connected with each other.

The above-mentioned two electroconductive layers may be electrically connected with each other through an electroconductive adhesive agent.

In the above paste printing method, the electroconductive layer may be an abrasion resistant electroconductive layer.

Furthermore, in the above paste printing method, each of the electroconductive layers may be an abrasion resistant electroconductive layer.

Furthermore, in the above paste printing method, as the electroconductive layer of the printing mask, any of chromium, nickel, aluminum, stainless steel and titanium coating electroconductive layers may be employed. Of these coating electroconductive layers, a titanium electroconductive layer is preferable in the present invention.

According to the above-mentioned paste printing methods of the present invention, since the electroconductive layer is grounded, paste printing can be performed while dissipating the triboelectric charges which are generated during the paste printing, and the electrostatic charges which are generated when the plastic mask is peeled away from the printing material. Thus, paste printing can be carried out under the conditions free from the electrostatic charges. Furthermore, the abrasion of the plastic mask, which may be caused by the repetition of the paste printing, can be prevented.

A further plastic mask of the present invention comprises a plastic sheet comprising at least one penetrating opening containing area which comprises a plurality of slit-shaped through-holes which are formed in a head-to-tail arrangement with a joint reinforcement portion being provided between each of the slit-shaped through-holes in the head-to-tail arrangement. The slit-shaped through-holes are arranged in a plurality of rows with the longer side of each of the slit-shaped through-holes being positioned side by side.

In the above-mentioned plastic mask, the thrusting of a squeegee into the inside of each slit-shaped through-hole in minimized since each joint reinforcement portion serves as a support for preventing the thrusting of the joint reinforcement portion into the slit-shaped through-holes. Even if the tip of the squeegee enters the slit-shaped through-holes and pulls the portions between the longer sides of the slit-shaped through-holes, which are hereinafter referred to as the ribs of the slit-shaped through-holes, the reinforcement portions can minimize the bending of the ribs. Thus, improper paste printing which might bq caused by the banding of the ribs can be prevented. Furthermore, since the banding of the ribs can be minimized, the breaking of the ribs and base portions thereof by the fatigue thereof caused by the repeated bending thereof can also be minimized, so that the life of the printing mask can be prolonged.

In the above plastic mask, the ends of each of the slit-shaped through-holes may be rounded. When the ends of each of the slit-shaped through-holes are rounded, even if the tip of the squeegee enters the slit-shaped through-holes, the concentration of the stress on the ends of each of the slit-shaped through-holes does not take place, so that the fatigue breaking of the ribs can be more effectively prevented.

In the above plastic mask, the rows of the slit-shaped through-holes may be arranged in parallel to each other, and the joint reinforcement portions may be disposed in line at a predetermined angle with respect to the parallel rows of the slit-shaped through-holes, for example, with right angles, with respect to the moving direction of the squeegee.

In this plastic mask, since the joint reinforcement portions are disposed in line, for instance, with respect to the moving direction of the squeegee, so that the bending of the ribs can be further reduced and therefore the ribs are protected against the pulling force applied thereto by the squeegee by a series of the joint reinforcement portions which are connected in line, whereby excellent paste printing can be carried out.

Still another paste printing method of the present invention comprises the steps of (1) bringing a paste printing mask comprising a penetrating opening containing area which comprises a plurality of slit-shaped through-holes formed in a predetermined pattern into close contact with a printing material; (2) filling each of the through-holes in the penetrating opening containing area with a paste by spreading and pressing the paste on the paste printing mask, and (3) removing the paste printing mask from the printing material, thereby forming on the printing material a paste pattern in the same pattern as hat of the slit-shaped through-holes in the penetrating opening containing area, wherein an the paste printing mask there is employed a plastic sheet comprising at least one penetrating opening containing area comprising a plurality of slit-shaped through-holes which are formed in a head-to-tail arrangement with a joint reinforcement portion between each of the slit-shaped through-holes in the head-to-tail arrangement in a plurality of rows with the longer side of each of the slit-shaped through-holes being positioned side by side.

In the above paste printing method, the edges of each of the slit-shaped through-holes are preferably rounded.

Furthermore, in the above paste printing method, it is preferable that the joint reinforcement portions be arranged in line at a predetermined angle with respect to each row of the slit-shaped through-holes.

In the above-mentioned paste printing method, the binding of the ribs of the slit-shaped through-holes is minimized and therefore the fatigue breaking of the ribs can be prevented, whereby high quality paste printing can be carried out.

According to the above paste printing method, the employed plastic mask is softer and more flexible than the metal masks and therefore can flexibly follow up any convex and concave portions on a printing surface to attain close contact therewith without any gap or with a minimum gap between the mask and the printing surface.

Furthermore, since the plastic mask is flexible, when it is peeled away from the printing surface, the plastic mask can be immediately returned to its original flat shape. In other words, in the plastic mask, there occurs no irreversible deformation as in the metal mask such an a nickel sheet formed by plating, when the mask is brought into close contact with a printing surface with convex and concave portions thereon.

Further, even if a small amount of the paste gets into the back aide of the plastic mask from the through-holes, and the solid particle contained in the paste are depressed between the printing mask and the printing surface, such depressed solid particles hardly adhere to the back side of the plastic mask since the surface of the plastic mask is extremely smooth and therefore the gap between the plastic mask and the printing surface, if any, is not increased by such solid particles. Therefore, on the printing surface, there can be formed a paste pattern which accurately corresponds to the pattern of the through-holes formed in the mask and is free from any spreading of the paste, whereby highly precise, high quality paste printing can be performed.

Furthermore, the paste printing can be repeated a number of times, without wiping the paste off the back side of the plastic mask or cleaning the back side of the plastic mask.

Other features of this invention will become apparent in the course of the following description of exemplary embodiments, which are given for illustration of the invention and are not intended to be limiting thereof.

Example [Method of Fabricating Plastic Mask]

As illustrated in FIG. 1, a polymer film 2 capable of absorbing part of an excimer laser beam was releasably stuck on a plastic sheet 1 through an adhesive agent 2a.

A polyimide film with a thickness of 125 $\mu$m was employed as the plastic sheet 1; and a polyester film with a thickness of 25 $\mu$m was employed as the polymer film 2 capable of absorbing part of an excimer laser beam. To this polyester film, a silicone adhesive agent was applied an the adhesive agent 2a. Thus, a layered material composed of the polyester film and the polyimide film was prepared.

As illustrated in FIG. 2, a polyester mesh screen 4 stuck on a mask frame 3, there was stuck by use of an adhesive agent 5 the thus prepared layered material cut with an appropriate size in such a posture that the polyester film came downward and the polyimide film serving as the plastic sheet 1 came upward.

After the adhesive agent 5 was cured, a plastic sheet body 6 to be subjected to excimer laser abrasion was prepared by cutting off an inside portion of the polyester mesh screen with respect to the applied adhesive agent 5.

As illustrated in FIG. 3, the plastic sheet body 6 was set on a working XY table 8 in such a manner that the polyester film of the plastic sheet body 6 was brought into close contact with the surface of the working XY table 8 by fixing the mask frame 3 to the working XY table 8 by a clump 7, whereby accurate registration of the plastic sheet body 6 at an excimer laser beam irradiation position was carried out by appropriately moving the working XY table 8.

The polyimide film of the plastic sheet 1 was irradiated with an excimer laser beam 10 which was output from an excimer laser beam generator 9 situated above the plastic sheet body 6, through a light-shielding aperture mask 11 with a pattern of through-holes of a plastic mask, a condenser lens 12 and then a lens 13.

The above excimer laser beam was generated with a wavelength of 248 $\mu$m by krypton-fluorine gas and at a pulse frequency of 200 Hz/sec, and the surface of the polyimide film was irradiated with this excimer laser beam at an energy density of 1.7 Joule/cm$^2$ through the condenser lens 12 and the lens 13, whereby the abrasion was carried out at an abrasion speed of about 0.5 $\mu$m/pulse for 1.25 seconds.

The plastic sheet body 6 was then detached from the working XY table 8, and the polyester film which was applied to the polyimide film was removed together with the silicone adhesive agent, whereby a plastic mask with a pattern of through-holes was obtained.

The thus obtained plastic mask was free from remaining films and non-clear-cut edges in the through-holes.

A minimum pitch of the pattern obtained by this method was 0.1 mm.

The thus fabricated plastic mask with a pattern with a pitch of 0.4 mm was brought into close contact with a printed circuit board made of glass epoxy. A solder paste containing spherical solid particles with a particle size of 20 $\mu$m to 44 $\mu$m was spread on the plastic mask by use of an urethane squeegee, and the pattern-shaped through-holes were filled with the solder paste.

The plastic mask was then removed from the printed circuit board, whereby a paste pattern of the through-holes was formed on the printed circuit board.

The paste-filling performance and paste-passing performance of the through-holes of the plastic mask were excellent, so that high quality paste printing with high precision of the pattern free from non-printing portions and improper spreading was carried out on the printed circuit board.

The back side of the plastic mask was not substantially smeared with the paste, so that it was possible to repeat the paste printing with high quality and high precision more than 100 times without wiping the paste and also without cleaning the back side of the plastic mask. In contrast, even in the case of an additive mask, which is considered to be beat of the metal masks in terms of the printing quality, the paste must be wiped from the back side of the mask at every several printings, and the back side of the mask must be cleaned at several ten times.

The excimer laser which is employed in the fabrication of the plastic mask of the present invention can perform the abrasion working, or non-heating or photochemical working which cannot be performed by other lasers such as $CO_2$ or YAG laser. The excimer lasers is particularly suitable for precise working of organic polymers.

The $CO_2$ or YAG laser working is thermal working which mainly utilizes laser beams with wavelengths in infrared region. In contrast to this, the abrasion working or non-heating working conducted by use of the excimer laser is carried out by utilizing the laser beams in ultraviolet region. When an organic polymer is irradiated with the excimer laser beam, the molecules of the organic polymer absorb the energy of the excimer laser beam and are excited to the extent that the bonds of the molecules are cleaved. AA a result, the organic polymer is decomposed to the constituents molecules and scattered in the form of a gas.

This decomposition process proceeds within several 10 ns, so that although the molecules are heated to about 6000° K at the time of the cleavage and scattered at an initial speed of as great as 5000 to 10000 m/sec, there is not enough time for the heated molecules to heat any materials adjacent to the heated molecules. Therefore in the abrasion working by the excimer laser, problems such as denaturation or modification which may be caused by the application of heat are never caused in the portions adjacent to the portion worked by the excimer laser beam, and the worked surface is extremely smooth and clean.

Furthermore, in the case of $CO_2$ or YAG laser working, a laser beam which is narrowed down is applied to a working subject. In sharp contrast to this, the excimer laser beam has a larger beam projection cross-section. For instance, some excimer laser beams have a beam projection cross-section with a major axis of about 20 mm and a minor axis of 8 to 9 mm. Thus, a larger area can be worked at a time by the excimer laser abrasion than by the $CO_2$ or YAG laser working.

When an excimer laser beam is used in practice, there may be the case where the output energy thereof is insufficient for performing actual abrasion. In such a case, the excimer laser beam is condensed. When condensed, the working area may be reduced to less than ½, but the excimer laser abrasion still has the advantage over other working methods that planar working is possible.

By utilizing this feature of the excimer lager abrasion, when a plastic sheet in irradiated with an excimer laser beam through a light-shielding aperture mask with a pattern of through-holes through which the excimer laser beam can pass, a thin concave portion or through-holes can be formed in a similar shape or pattern to that of the pattern in the light-shielding aperture mask can be formed in the plastic sheet. Thus, there can be prepared a printing plastic mask with excellent smoothness of the inner walls of the through-holes.

By this excimer laser abrasion, a plastic mask with a pattern of through-holes with a pitch of as small as 0.1 mm can be fabricated.

Furthermore, according to the plastic fabrication method of the present invention, a polymer film which is capable of absorbing at least part of the excimer laser beam is disposed in close contact with the back surface of the plastic sheet which is opposite to the excimer laser beam irradiation side thereof; the plastic sheet is irradiated with the excimer laser beam to form through-holes in the plastic sheet; and the polymer film is removed from the plastic sheet, whereby there can be formed a plastic mask which is free from thin films which may remain at the bottom of each through-hole, the so-called "remaining thin films" and free from non-clear-cut edges in the through-hole, the so-called "non-clear-cut edges", or there can be formed a plastic mask with minimized formation of such "remaining thin film" and "non-clear-cut edges".

In particular, a plastic mask with through-holes with a minimum pitch of 0.1 mm to about 0.01 mm, free from the "remaining thin film" and "non-clear-cut edges" or with minimized formation thereof, can be fabricated according to the present invention.

The above-mentioned minimum pitch obtained by the plastic mask of the present invention is in the range of ¼ to ⅓ the minimum pitch obtained by the conventional metal mask, which is in the range of 0.4 mm to 0.3 mm.

Figure 4B:
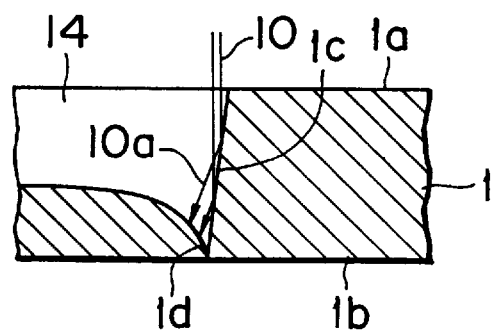
Figure 4C:
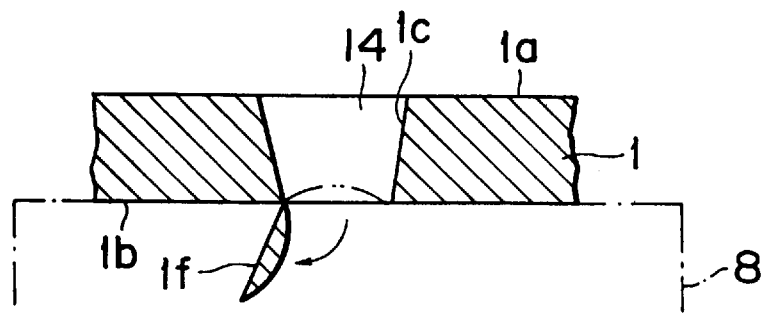

With respect to the non-formation of the "remaining thin film" in the plastic mask fabrication method of the present invention, the following mechanism can be considered:

FIGS. 4(a) to 4(c) show a mechanism for the formation of the "remaining thin film" in a plastic mask fabrication method. FIG. 4(a) shows the formation of part of a through-hole in the plastic sheet. FIG. 4(b) is an enlarged partial view of a gouged portion in the bored through-hole. FIG. 4(c) shows a remaining thin film.

As shown in FIG. 4(a), an excimer laser beam irradiation surface 1a of a plastic sheet 1 is irradiated with an excimer layer beam 10, part of a through-hole 14 with a tapered inner wall to the bottom as illustrated in FIG. 4(a) is formed. In the course of the formation of the through-hole 14, a loser beam reflected by the tapered inner wall 1c, which is hereinafter referred to as the reflected laser beam 10a, proceeds the abrasion of a corner portion id to form a gouged portion therein.

When the abrasion of the corner portion 1d does not proceed uniformly, a thin film if is formed and turned to the back side 1b of the plastic sheet 1 on a portion which is slightly connected to the plastic sheet 1 and serves as a pivot for the turning of the thin film 1f, in a portion of the plastic sheet 1 which is not in close contact with a working table 8, by the repulsion of the abrasion. The thin film if is then no longer irradiated with the excimer laser beam 10, so that the thin film 1f remains at the bottom of the through-hole 14.

In sharp contrast to this, according to the printing plastic mask fabrication method of the present invention, a polymer film is in close contact with the back side of the plastic sheet which is opposite to the excimer laser beam irradiation surface thereof, so that the thin film at the bottom of the through-hole which is about to be completely formed by the excimer laser beam abrasion is not turned to the back side of the plastic sheet and remains until the through-hole is completely formed, and such a thin film does not remain. Even if some thin film remains on the polymer film which is in close contact with the plastic sheet, since the polymer film is removed after the formation of the through-hole, no thin film remains on the printing plastic mask.

Figure 5:
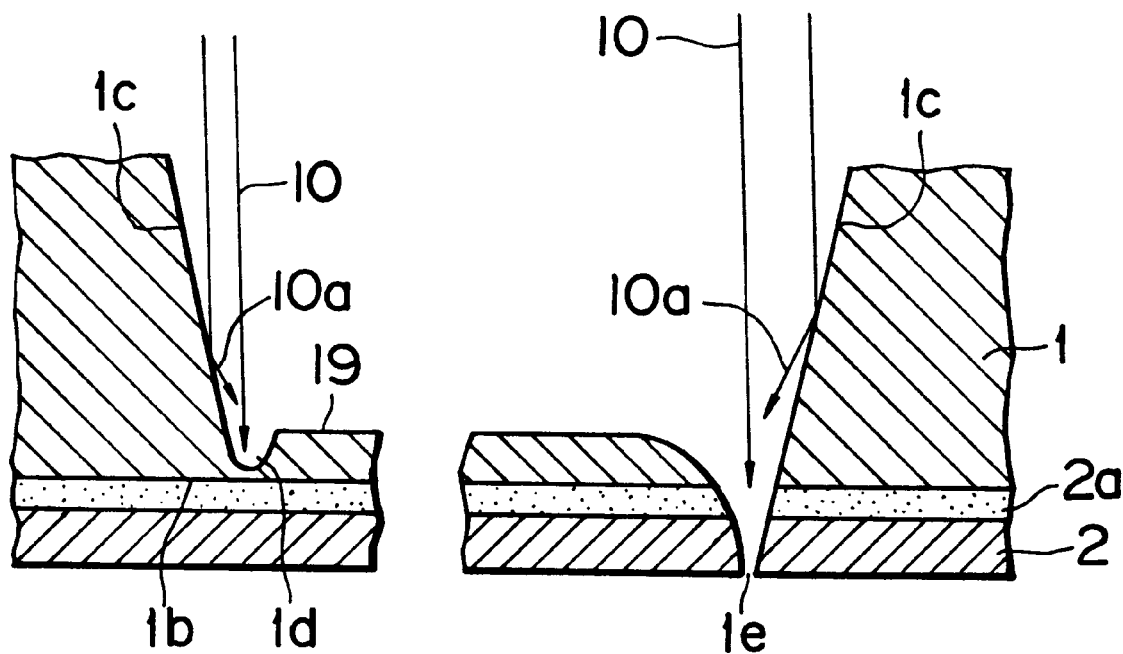
FIG. 5 is a schematic cross-sectional view of a bottom portion of a through-hole which is about to be completely formed in a plastic sheet during the fabrication of a plastic mask.

FIG. 5 schematically shows the state of the bottom of a through-hole which is about to be completely formed by the excimer laser beam by the plastic mask fabrication method of the present invention. As shown in FIG. 5, a gouged portion is formed at a corner portion 1d between a bottom surface 1g and an inner wall 1c of the through-hole since the abrasion is significantly promoted because of an increased energy density due to the overlapping of a reflection laser beam 1a reflected by the tapered surface of an inner wall 1c and a direct laser beam 10 which is directly projected from right above.

On the other hand, at the other corner 1e, an inner wall 1c is cut off the bottom surface 1g. When the number of the cut-off corners is increased and the number of connected portions is decreased, the thin film at the bottom of the through-hole receives such a force that makes the thin film turn pivotally on a singly connected portion at the corner portion 1d toward the back side 1b of the plastic sheet by the repulsion force which in generated by the molecules which are scattered in the state of a plasma at an initial speed of 5000 to 10,000 m/sec by the excimer laser beam abrasion. However, the thin film is not moved to the back side 1b of the plastic sheet because it is stopped by the polymer film 2 disposed at the lower side of the bottom portion 1g through an adhesive agent 2a, which polymer film 2 is capable of absorbing at least part of the excimer laser beam. As a result, the thin film in irradiated by the excimer laser beam until the through-hole is completely made, so that the thin film does not remain.

Figure 6A:
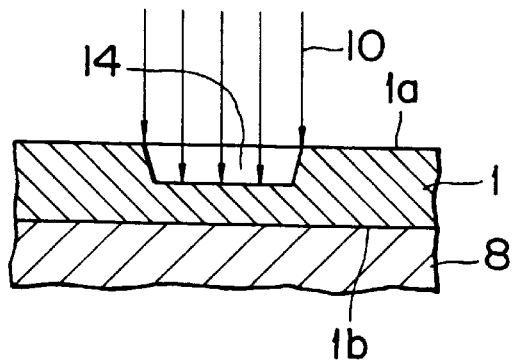
FIGS. 6(a), 6(b) and 6(c) are schematic cross-sectional views of a through-hole during the formation thereof in a plastic sheet, showing a mechanism for the formation of a non-clear-cut edge in the through-hole during the fabrication of a plastic mask.
Figure 6B:
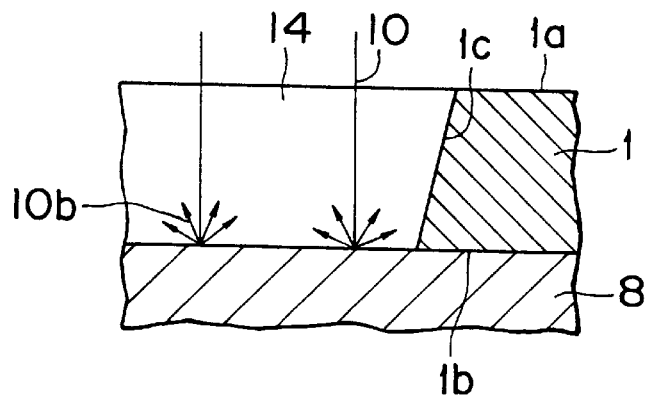
Figure 6C:
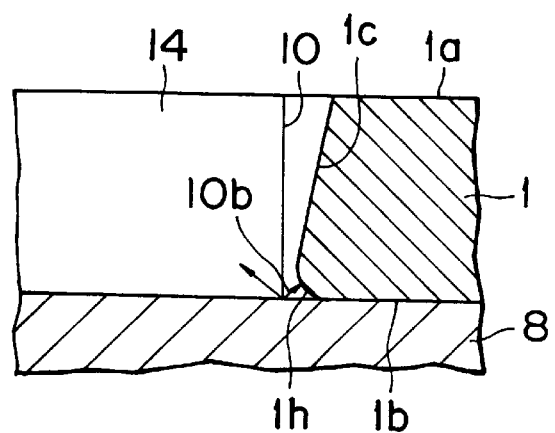

According to the plastic mask fabrication method of the present invention, there are formed no "non-clear-cut edges" in the through-holes or the formation of the "non-clear-cut edges" is minimized. It is considered that this is accomplished by the following mechanism:

FIGS. 6(a) to 6(c) show the mechanism for the formation of the "non-clear-cut edges" in the through-holes.

FIG. 6(a) shows the state of the formation of part of a through-hole. FIG. 6(b) is an enlarged view of part of a through-hole immediately after the formation thereof. FIG. 6(c) is an enlarged view of a non-clear-cut edge formed in the through-hole.

As shown in FIG. 6(a), a through-hole 14 is being formed as the plastic sheet 1 in close contact with the working table 8 is irradiated with the excimer laser beam 10.

As shown in FIG. 6(b), after the formation of the through-hole 14, the applied excimer laser beam 10 is scattered by the surface of the working table 8 as shown by 10b.

As shown in FIG. 6(c), the lower end portion of the through-hole 14 formed in the plastic sheet 1 is abraded by the excimer laser beam 10b scattered near the lower end portion of the through-hole 14, so that the edge of the through-hole 14 is rounded and the "non-clear-cut edge" 1h is formed at the lower end portion of the through-hole 14.

In contrast to this, according to the plastic mask fabrication method of the present invention, the polymer film is applaud to the back side of the plastic sheet opposite to the excimer laser beam irradiation surface thereof, so that after the formation of the through-hole, the excimer laser beam is attenuated, but reaches the working table. Part of the excimer laser beam is reflected by the surface of the working table and absorbed by the polymer film, so that the lower end portion of the through-hole is no longer abraded by the reflected excimer laser beam. Thus, the formation of the "non-clear-cut edge" in the through-hole can be prevented.

When a through-hole which passes through the plastic sheet and the polymer film is formed, the excimer laser beam is not attenuated unit it reaches the working table. However, the excimer laser beam is reflected by the surface of the working table and then absorbed by the polymer film which is in close contact with the plastic sheet at the edge portion of the through-hole, so that the reflected excimer laser beam is attenuated. Thus, the lower end portion of the through-hole is no longer abraded by the reflected excimer laser beam, and therefore the formation of the "non-clear-cut edge" in the through-hole can be prevented. In this case, it may occur that the polymer film which is in close contact with the plastic sheet is abraded at the lower portion of the through-hole and a non-clear-cut edge is formed at the polymer film. However, since the polymer film is removed from the plastic sheet after the formation of the through-hole, such abrasion in the polymer film has no adverse effects on the paste printing by use of the plastic mask thus prepared.

Furthermore, in the case where there is formed a through-hole which passes not only through the plastic sheet, but also through the polymer film, the excimer laser beam reflected by the surface of the working table reaches the inner wall of the through-hole, but the inner wall is rarely abraded by the reflected excimer laser beam. It is considered that this may be because the Intensity of the received excimer laser beam per unit area on the inner wall of the through-hole is significantly decreased by (1) the attenuation of the excimer laser beam reflected by the surface of the working table, (2) the decrease of the energy density thereof by the scattering of the laser beam by the reflection, and (3) the slanting projection of the laser beam from the lower position onto the inner wall of the through-hole.

Figure 7:
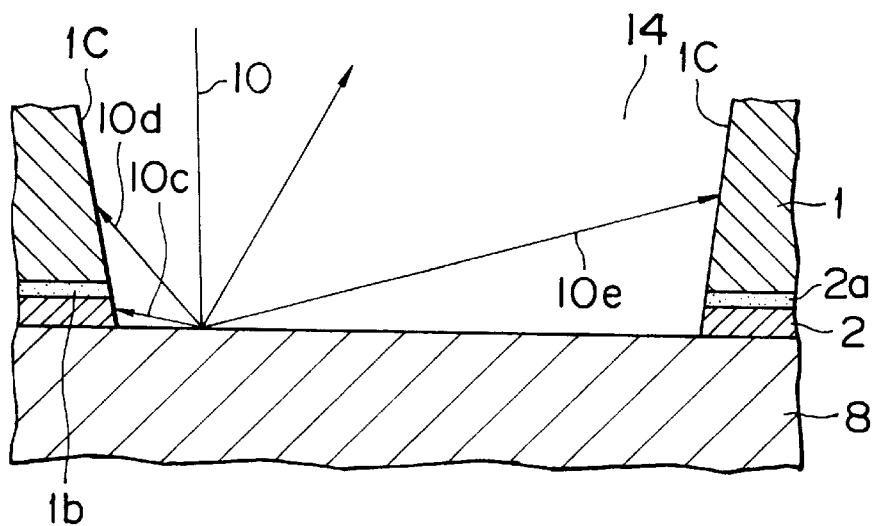
FIG. 7 is a schematic cross-sectional view of a through-hole which pauses through both a plastic sheet and a polymer film by excimer laser abrasion during the fabrication of a plastic mask.

FIG. 7 schematically shows a through-hole which passes not only through the plastic sheet, but also through the polymer film, formed by the plastic mask fabrication method of the present invention.

When the excimer laser beam abrasion proceeds, the plastic sheet 1, the adhesive agent 2a and the polymer film 2 in the respective abraded portions are scattered and disappear. The excimer laser beam 10 reaches the working table 8, and is partly absorbed by the working table 8 and reflected by the working table 8, whereby scattered beaus 10c, 10d, 10e and the like are formed.

The scattered beams 10d and 10e strike at the inner wall 1c of the through-hole formed in the plastic sheet 1. However, the energy density of the scattered beam 10d per unit area of the inner wall 1c is significantly lowered because of the attenuation of the energy density thereof by the scattering of the beam, and the slanted projecting direction with respect to the inner wall 1c.

With respect to the scattered beam 10e, the slanted projection angle with respect to the inner wall 1c is smaller than that of the scattered beam 10d, but the travelling distance up to the inner wall 1c is larger than that of the scattered beam 10d, so that the attenuation of the energy density of the scattered beam 10e is much larger than that of the scattered beam 10d.

Therefore, it is not considered that the inner wall 1c of the through-hole 14 is abraded by any of the scattered beams 10d and 10e.

The scattered beam 10c reflected immediately near the inner wall 1c of the through-hole 14 is small in the scattering of the energy thereof, so that it is possible that the lower tip portion of the polymer film 2 is abraded by the scattered beam 10c. However, the polymer film 2 is removed together with the adhesive agent 2a after the formation of the through-hole, so that the abrasion of the polymer film 2 does not have any adverse effect on the paste printing by use of this plastic mask.

When paste printing is performed by use of the plastic mask prepared by the plastic mask fabrication method of the present invention, the plastic mask is used upside down.

Therefore, when no "non-clear-cut edges" are formed in the through-hole formed in the plastic shoot, the narrowest opening portion of the through-hole comes to the uppermost surface of the plastic mask when used in practice for paste printing, and even if some "non-clear-cut edges" are formed in the through-hole, the narrowest opening portion of the through-hole comes near the uppermost surface of the plastic mask when used in practice.

Figure 8A:
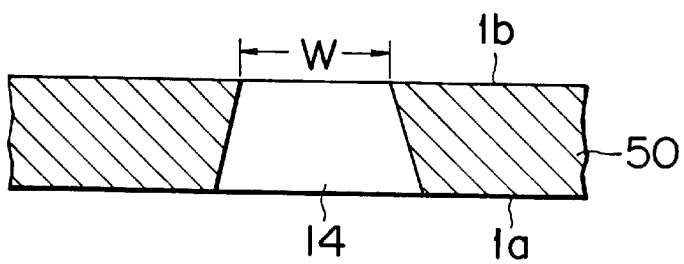
FIG. 8(a) is a schematic cross-sectional view of a through-hole free from a non-clear-cut edge.

FIG. 8(a) is a schematic cross sectional view of a through-hole free from a non-clear-cut edge formed in a plastic mask 50. As shown in FIG. 8(a), the narrowest opening portion W is formed at the uppermost surface of the plastic mask 50.

Figure 8B:
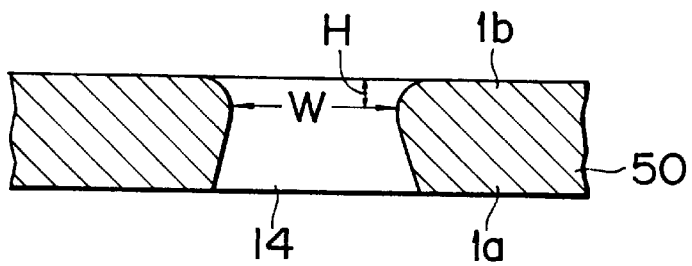
FIG. 8(b) in a schematic cross-sectional view of a through-hole free with a non-clear-cut edge.
Figure 10:
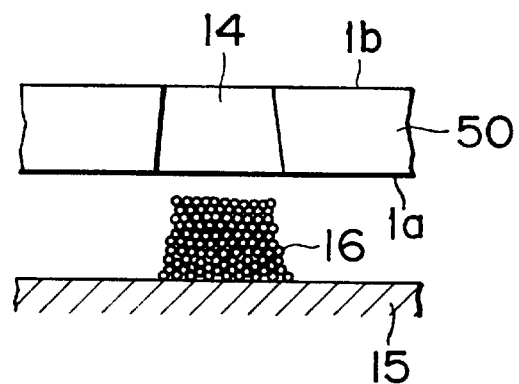
FIG. 10 is a schematic cross-sectional view of a through-hole through which a paste passes to form a through-hole pattern on a printing material.

FIG. 8(b) is a schematic cross sectional view of a through-hole with a non-clear-cut edge formed in a plastic mask 50. As shown in FIG. 8(b), the narrowest opening portion W is formed very close to the uppermost surface of the plastic mask 50 at a depth H therefrom.

According to the plastic mask fabrication method of the present invention, there can be fabricated a plastic mask with through-holes free from the "remaining thin films" and "non-clear-cut edges" or with minimized formation thereof, with the depth of the through-holes from the uppermost surface of the plastic mask to the narrowest portion of the through-holes being 25 μm or less, 20 μm or less, 15 μm or less, 10 μm or less, and 5 μm or less, if necessary.

Such a plastic mask for printing can be selectively used in accordance with the fabrication efficiency and the kind of a paste to be used in printing.

Plastic mask; free from the "remaining thin films" and "non-clear-cut edges", and plastic mask free from the "remaining thin films" and a minimum depth from the uppermost surface of the mask to the narrowest portion of the through-holes are preferable for use since such plastic masks can be used in any kinds of pants printing for obtaining fine patterns free from non-printed portions or improper spreading.

The inventor of the present invention has made investigations about a paste printing method by use of the thus fabricated plastic mask and discovered that in a paste printing for printing a pattern of a paste containing solid particles on a printing material by cringing the plastic mask into close contact with the printing material, spreading the paste on the plastic mask to fill a pattern of through-holes formed in the mask with the paste, removing an excessive paste from the surface of the mask, and removing the mask from the printing material, high quality paste printing can be carried out, with excellent taste-filling performance and paste-passing performance with respect to the through-holes, when the depth from the uppermost surface of the mask to the narrowest portion of each through-hole is not more than ½ the particle size of the solid particles contained in the paste.

It is considered that the above-mentioned excellent paste-filling performance and paste-passing performance can be attained by the following mechanism in this printing method.

FIGS. 9(a) to 9(c) schematically show the steps of the filling of the paste in a through-hole free from "non-clear-cut edge" in a pattern of fine through-holes formed in a plastic mask fabricated by the plastic mask fabrication method of the present invention.

FIG. 9(a) shows the stop of the initiation of the spreading of the paste. FIG. 9(b) shows the stop of scraping the spread paste. FIG. 9(c) shows the step of filling the through-hole with the paste.

As shown fin FIG. 9(a), when a paste 16 is spread by a squeegee 17 on the surface of a plastic mask 50 which is set in close contact with a printing material 19, the paste 16 is moved along the surface of the plastic mask 50 as the paste 16 rolls and slips on the plastic mask 50.

The paste 16 then passes over the upper portion of a through-hole 14, and the lower portion of the paste 16 is then scraped by the front upper end 14a of the through-hole 14 as shown in FIG. 9(b). The scraped paste 16 is then moved toward the squeegee 17 and the through-hole 14 is then felled with the successively scraped paste 16.

When the plastic mask with the through-holes being thus filled with the paste 16 is removed from the printing material 15, the paste 16 is caused to smoothly pass through the through-hole 14, so that a pattern of fine through-holes free from non-printed portions and improper spreading is printed on the printing material 15.

Even if there is a slight non-clear-cut edge in the through-hole 14, when the depth from the uppermost surface of the plastic mask to the narrowest portion of the through-hole 14 is not more than ½ the particle size of the solid particles contained in the paste, a pattern of fine through-holes free from non-printed portions and improper spreading can be printed on the printing material 15, with excellent paste-filling performance and paste-passing performance.

Figure 11:
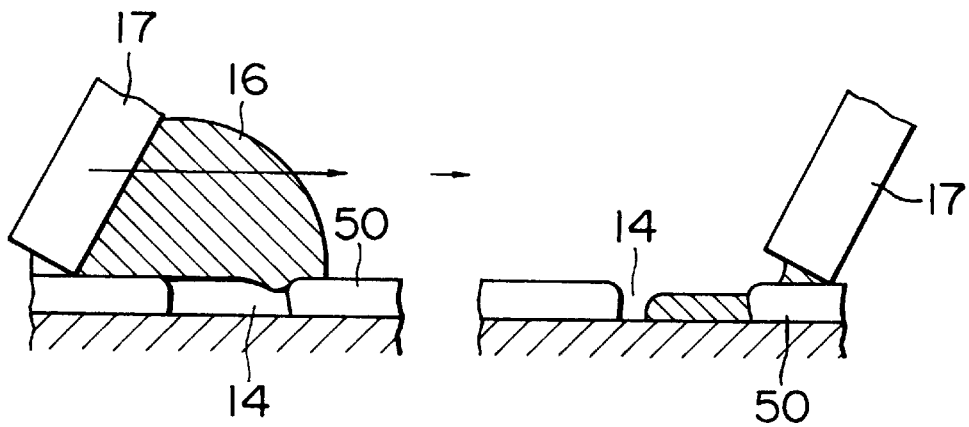
FIG. 11 schematically shows the mechanism of insufficient filling of a paste in a through-hole with a non-clear-cut edge in a plastic mask.
Figure 12:
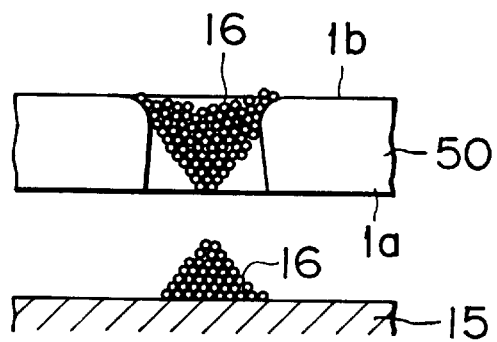
FIG. 12 schematically shows the formation of a paste pattern with a non-printed portion on a printing material by a through-hole with a non-clear-cut edge, with the paste being caught by the upper end portion of the through-hole, and with poor paste-passing performance thereof.

In contrast to this, when the depth from the uppermost surface of the plastic mask to the narrowest portion of the through-hole 14 exceeds ½ the particle size of the solid particles contained in the paste, it is difficult for the lower portion of the paste 16 to be scraped by the front upper end 14a of the through-hole 14 as shown in FIG. 11, so that the filling of the through-hole 14 with the paste becomes insufficient. Furthermore, as shown in FIG. 12, wren the plastic mask 50 is removed from the printing material 15, part of the paste 16 is caught by the non-clear-cut edge of the upper portion of the through-hole, so that the paste-passing performance is degraded and a paste pattern with a non-printed portion is printed ci %-he printing material 15.

As the material for the plastic sheet for use in the present invention, any organic polymers which permit excimer laser beam abrasion :an be employed. Even an organic polymer for which excimer laser beam abrasion i8 difficult or impossible to conduct, can also be subjected to excimer laser beam abrasion by mixing therewith a compound capable of absorbing excimer laser beam such as finely-divided carbon particles and an ultraviolet absorbing agent, or an organic polymer which can be subjected to the excimer laser beam abrasion.

It is preferable that the plastic sheet for use in the present invention have the properties that are required for the plastic mask, namely, the following properties: (1) chemical resistance, for example, against the paste, solvents contained in the paste, and cleaning agents employed after paste printing; (2) sufficient abrasion resistance for use as a printing sheet; (3) sufficient mechanical strength for attaining dimensional stability when tension is applied when it is mounted on a frame; and (4) low friction, and water repellency suitable for attaining the previously mentioned excellent paste-pas sing performance.

Specific examples of the plastic sheet for use in the present invention are organic polymers for which the excimer laser beam abrasion can be easily conducted, such as polyimide, polyester, epoxy resin and polycarbonate; and organic polymers for which the excimer laser beam abrasion is difficult or impossible to conduct, such as polyethylene, polypropylene, polyacetal and teflon.

The latter organic polymers can be used by mixing therewith a compound capable of absorbing excimer laser beam, or an organic polymer which can be subjected to the excimer laser beam abrasion as mentioned previously.

It is preferable that the plastic sheet, or the plastic mask of the present invention, have a thickness in the range of about 10 $\mu$m to 500 $\mu$m; and that a plastic mask for paste printing by use of a solder paste of the present invention have a thickness in the range of about 100 $\mu$m to 200 $\mu$m.

It is also preferable that the plastic mask of the present invention have a modulus of bending elasticity of about 20 to 500 Xgf·mm$^{-2}$. A plastic mask with a thickness in the above-mentioned range and the above-mentioned modulus of bending elasticity is capable of eliminating or minimizing the gaps between the plastic mask and a printing material when the plastic mask is brought into close contact with the printing material even if the printing material has some convex portions on the surface thereof, whereby the entering of the paste the gaps between the plastic mask and the printing material can be prevented. As a result, a paste pattern free from improper spread can be sharply formed. Furthermore, since the back side of the plastic mask is not smeared or hardly smeared with the plate, the plastic mask can be repeatedly used for an extended period of time without cleaning the back side of the plastic mask.

An the material for the polymer film capable of absorbing excimer laser beam for use in the plastic mask fabrication method of the present invention, the same material as that for the above-mentioned plastic sheet for use in the present invention can be employed. It is preferable that as the material for the polymer film, a tenacious material that can be smoothly peeled away from the plastic sheet, without being broken, not easily pulled apart or torn be employed. In practice, it is preferable that the same material as that for the plastic sheet be employed for the polymer film for the excimer laser beam abrasion.

It is preferable that the polymer film have a thickness of about 5 $\mu$m to 50 $\mu$m.

In the plastic mask fabrication method of the present invention, the polymer film can be disposed in close contact with the back side of the plastic sheet opposite to the excimer laser beam irradiation side thereof, for example, by any of the following methods: (a) the polymer film is brought into pressure contact with the plastic sheet; (b) the polymer film is covered with a plastic sheet which is larger than the polymer film and the polymer film is attracted to the plastic sheet by air suction; and (c) a polymer film coated with an adhesive agent is releasably applied to the plastic sheet.

As the adhesive agent for the above-mentioned purpose, it is preferable to use an adhesive agent which is capable of absorbing excimer laser beams, or which contains a material capable of absorbing excimer laser beams, or which allows the passage of the excimer laser beams or is transparent thereto.

It is also preferable that the adhesive agent be such an adhesive agent that allows the peeling of the polymer film away from the plastic sheet without remaining thereon.

When the polymer film is stuck on the plastic sheet through the adhesive agent, for example, a plastic sheet is unrolled from a roll of the plastic sheet, and a polymer film coated with an adhesive layer thereon is also unrolled from a roll of the polymer film, and the adhesive layer of the polymer film is brought into close contact with the plastic sheet unrolled from the roller thereof by causing the polymer film and the plastic sheet to pass between pressure application rollers, and the polymer-film-applied plastic sheet is wound around a take-up roller. This method permits continuous preparation of the polymer-film-applied plastic sheet by using rollers. It in preferable that no bubbles and wrinkles be formed during the sticking of the polymer film on the plastic sheet.

A plastic mask of the present invention, which comprises a plastic sheet in which a pattern of through-holes is formed and an electro-conductive layer formed on the plastic sheet, and a paste printing method of the present invention, which uses the above plastic mask, will now be explained.

Figure 13:
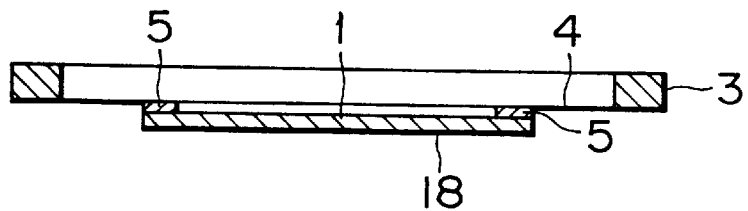
FIG. 13 is a schematic cross-sectional view of a plastic mask provided with an electroconductive layer of the present invention, showing the entire structure thereof.
Figure 14:
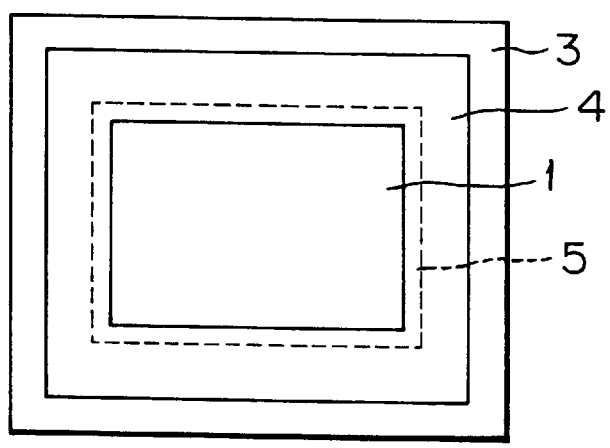
FIG. 14 is a schematic plan view of the plastic mask in FIG. 13, showing the entire structure thereof.
Figure 15:
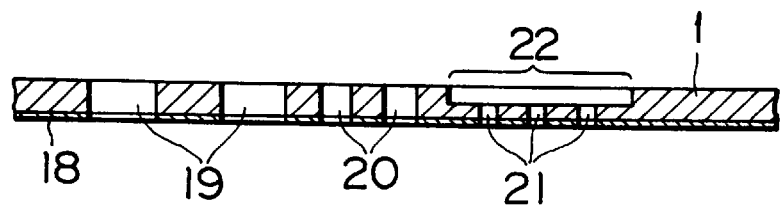
FIG. 15 is a schematic enlarged partial sectional view of a first example of a plastic mask provided with an electroconductive layer of the present invention.

FIGS. 13 to 15 schematically show a first example of the plastic mask of the present invention, which is provided with an electroconductive layer.

FIG. 13 is a schematic cross-sectional view of the plastic mask showing the entire structure thereof.

FIG. 14 is a schematic plan view of the plastic mask showing the entire structure thereof.

FIG. 15 is an enlarged partial sectional view of FIG. 13.

In this plastic mask, only the lower surface of the plastic sheet is coated with an electroconductive layer. This plastic mask is used for the printing of an electroconductive paste.

In FIGS. 13 and 14, a mask frame 3 is generally made of an aluminum cast or aluminum square pipe. On the mask frame 3, a polyester mesh screen 4 with about 180 to 225 meshes with a cut-off portion in the central portion thereof is mounted with the application of a predetermined tension thereto. In the central portion of the polyester mesh screen 4, a plastic sheet 1 made of polyimide with a thickness of 125 $\mu$m in mounted by use of an adhesive agent 5.

On the lower surface of the plastic sheet 1, an electroconductive layer 18 made of titanium with a thickness of about 2000 Å is provided by sputtering deposition as illustrated in FIG. 15.

As mentioned above, as the material for the plastic sheet 1, polyimide is employed with the mechanical strength and chemical resistance thereof taken into consideration.

Furthermore, as the material for the electroconductive layer 18, titanium is employed for the improvement of the abrasion resistance of the electroconductive layer 18.

In FIG. 15, reference numeral 19 indicates a large through-hole for large electronic parts to be provided on the plastic sheet 1; reference numeral 20 indicates a medium through-hole for medium electronic parts; and reference numeral 21 indicates a micro through-hole for fine pitch electronic parts to be provided in a half-etching portion 22. The through-holes 19 to 21 and the half-etching portion 22 can be easily formed by appropriate selection of the shape of a light-shielding aperture mask for the irradiation of the plastic sheet 1 with an excimer laser beam end by the adjustment of the energy density of the excimer laser beam employed and the number of the irradiation pulses thereof.

Figure 16:
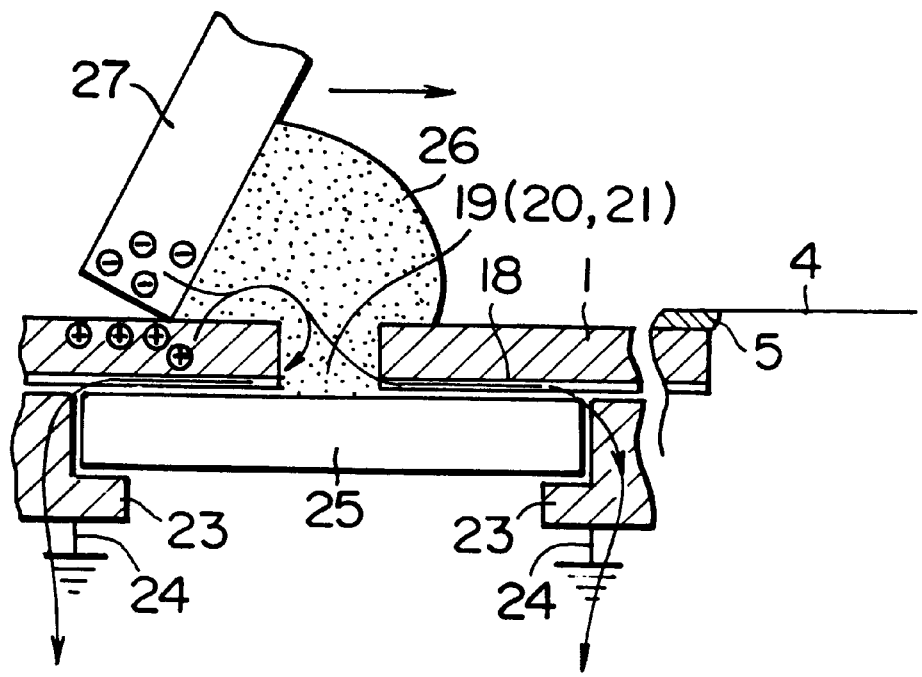
FIG. 16 is a schematic diagram in explanation of a method of paste printing by use of the first example of the plastic mask provided with an electroconductive layer.
Figure 17:
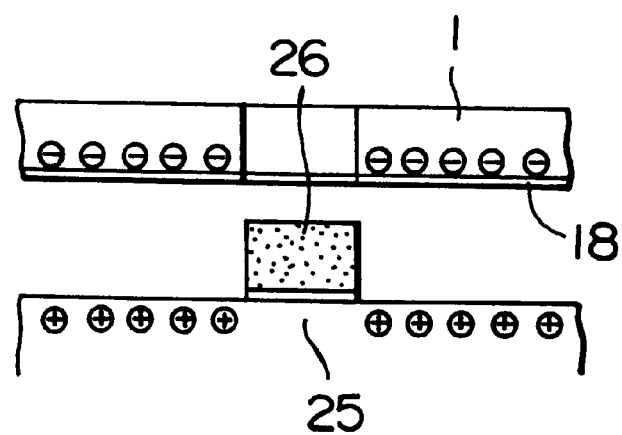
FIG. 17 is a schematic diagram in explanation of the peeling charges generated between a plastic mask and a print-circuit board.
Figure 18:
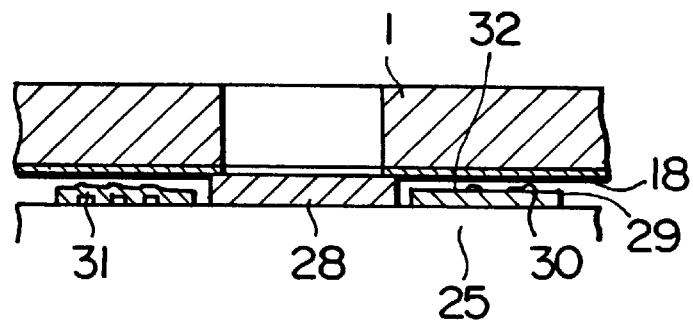
FIG. 18 is a schematic cross-sectional view of a plastic mask placed on a print-circuit board for explanation of the close contact state thereof.

With reference to FIG. 16, a method of printing an electroconductive solder paste on a printed circuit for actually mounting electronic parts thereon by use of the above-mentioned plastic mask will now be explained.

When the above-mentioned printing is performed, it a necessary that the metal structural parts of a printer, such as a metal clamp 23, be grounded in advance through appropriate means such as an earthing wire 24 as illustrated in FIG. 6. This is for grounding electrostatic charges generated in the plastic mask during the printing process, thereby making the plastic mask antistatic.

After the metal structural parts of the printer, such as the clamp 23, are grounded, the printing operation is carried out as follows:

The printed circuit board 25 to be soldered is placed on a pair of right and left clamps 23 of the printer. The plastic mask is then mounted on the printed circuit board 25 in such a manner that the electroconductive layer 18 of the plastic mask comes into contact with the printed circuit board 25 as shown in FIG. 16. Pressure is applied to the plastic mask in its entirety by pressure application means (not shown), whereby the surface of the printed circuit board 25 is brought into close contact with the metal structural parts such as the clamps 23.

A predetermined amount of an electroconductive solder paste 26 is placed on the plastic sheet 1, and the electroconductive solder paste 26 is spread on the plastic sheet 1 by a urethane squeegee 27, whereby the through-hole 19 (20, 21) formed in the plastic sheet 1 in filled with the electroconductive solder paste 26. When the through-hole 19 has been filled with the electroconductive solder paste 26, the plastic mask is peeled away from the printed circuit board 25, whereby the same paste pattern as that of the through-holes 19 (20, 21) is formed on the printed circuit board 25.

An mentioned previously, when a solder paste is printed on the plastic sheet 1 by the urethane squeegee 27, the surface of the plastic sheet 1 is rubbed by the tip of the urethane squeegee 27. As a result, the tip of the urethane squeegee 27 and the surface of the plastic sheet 1 are respectively triboelectrically charged to an opposite polarity which depends upon the respective triboelectric series thereof.

As shown in FIG. 16, when as the squeegee, the urethane squeegee 27 is used, and an the plastic sheet 1, a plastic sheet made of polyimide, the urethane squeegee 17 is charged to a positive polarity, while the plastic sheet 1 is charged to a negative polarity.

The thus generated electrostatic charges remain on the surfaces of the urethane squeegee 27 and the plastic sheet 1 which are both electrically insulating and do not dissipate so long as no specific quenching step is taken.

In the present invention, however, the generated triboelectric charges are partly quenched through the electroconductive solder paste 26 which is close contact with the triboelectric charge generation source, and at the same time, the remaining electrostatic charges are dissipated in the direction of the arrows through the electroconductive solder paste 26 in the through-hole 19 (20, 21), the electroconductive layer 16 coated on the lower surface of the plastic sheet 1, the clamps 23 of the printer, and the earthing wire 24.

Therefore, even if an electrically insulating squeegee made of a plastic material, such as the urethane squeegee 27 is employed, the squeegee is not electrostatically charged in the present invention. Therefore, in the actual mounting operation for mounting electronic parts on print-circuit boards by the duplex reflow soldering method, the mounted electronic parts are not subjected to electrostatic destruction.

Furthermore, when the plastic mask is peeled away from the print-circuit hoard 25 after the completion of the printing, peeling electrostatic charges are generated as illustrated in FIG. 67. However, generally, on the surface of the print-circuit board 25, there are minute convex and concave portions because of the presence of, for example, a pad 28, a resist 29, a display ink 30, and a pattern projection 31, so that there are gaps 32 between the print-circuit board 25 and the plastic sheet 1. The generation of the peeling electrostatic charges is so slight that the mounted electronic parts are never subjected to electrostatic destruction.

Even if some peeling electrostatic charges are generated, such charges are grounded and dissipated before the electroconductive layer 18 is separated from the clamps 23. therefore there is no risk of the electrostatic destruction.

Even after the electroconductive layer 18 is separated from the clamps 23 of the printer, if there remains a contact portion between the plastic mask and the print-circuit board, there may be generated the peeling electrostatic charges when the plastic mask is peeled away from the print-circuit board. However, the potential of the generated peeling electrostatic charges is so low that there will be no problems.

Furthermore, the thus generated peeling electrostatic charges are distributed to the entire surface of the electroconductive layer 19, so that the potential thereof never reaches such a level as to destroy the mounted electronic parts, even if the peeling electrostatic charges remain on the plastic sheet 1.

Furthermore, even if the peeling electrostatic charges remain on the plastic sheet 1, the charges are dissipated through the electroconductive layer 18, the clamps 23 and the earthing wire 24 whenever the solder paste printing is carried out.

The above-mentioned peeling electrostatic charges are generated not only on the plastic sheet 1, but also on the print-circuit board 25 as counterpart charges. The potential of the peeling electrostatic charges generated on the print-circuit board 25 is not more than 50 volts per one peeling, so that should the peeling electrostatic charges with Each a potential flows through inner micro circuits such as ROM and RAM which are vulnerable to electrostatic charges, the risk of the electrostatic destruction thereof can be minimized.

The conditions for the electrostatic charging at the peeling are the same in the duplex reflow soldering method by use of a metal mask, which is now in general use, and peeling electrostatic charges are generated on print-circuit boards in the same manner, but the electrostatic destruction is not caused by the peeling electrostatic charges.

In the present invention, an abrasion resistant electroconductive layer, for example, an electroconductive layer 18 made of titanium, is provided on the lower surface of the plastic sheet 1, whereby the abrasion resistance of the plastic sheet 1 is improved.

A plastic mask comprising a plastic sheet 1 made of polyimide resin with a thickness of 125 μm and an electroconductive layer 18 made of titanium with a thickness of about 2000 Å provided on the lower surface of the plastic sheet 1 by sputtering deposition, was subjected to a printing durability test under the same conditions de for a metal mask. The result was that substantially no abrasion was observed in the electroconductive layer 18 in 15,000 times printings. This result indicates that the above plastic mask will be durable in at least more than several ten thousand printings. Thus, it was confirmed that this plastic mask had not problems for use in practice.

As the paste, many insulating pastes are also used in addition to the above-mentioned electroconductive paste.

When an insulating paste is printed, it is necessary to take some antistatic countermeasure. In this case, however, the paste itself cannot be used as a charge quenching route for grounding.

Figure 19:
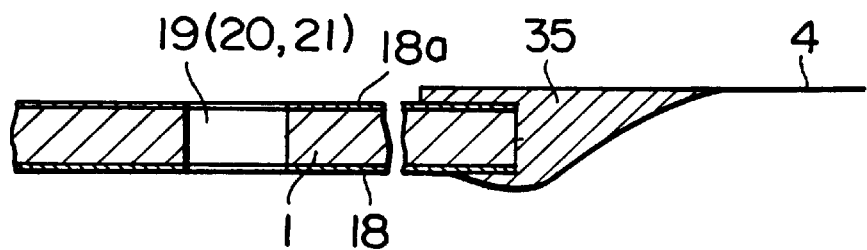
FIG. 19 is a schematic partial enlarged cross-sectional view of a second example of the plastic mask provided with an electroconductive layer.

FIG. 19 shows a second example of the plastic mask of the present invention, which is suitable for printing with such an insulating paste.

In the plastic mask 1 shown in FIG. 19, an electroconductive layer 18a is provided on the upper surface of the plastic sheet 1, in addition to the electroconductive layer 18 provided on the lower surface of the plastic sheet 1, and the upper and lower electroconductive layers 18a and 18 are electrically connected by use of an electroconductive adhesive agent 35 at an edge portion of the plastic sheet 1.

Figure 20:
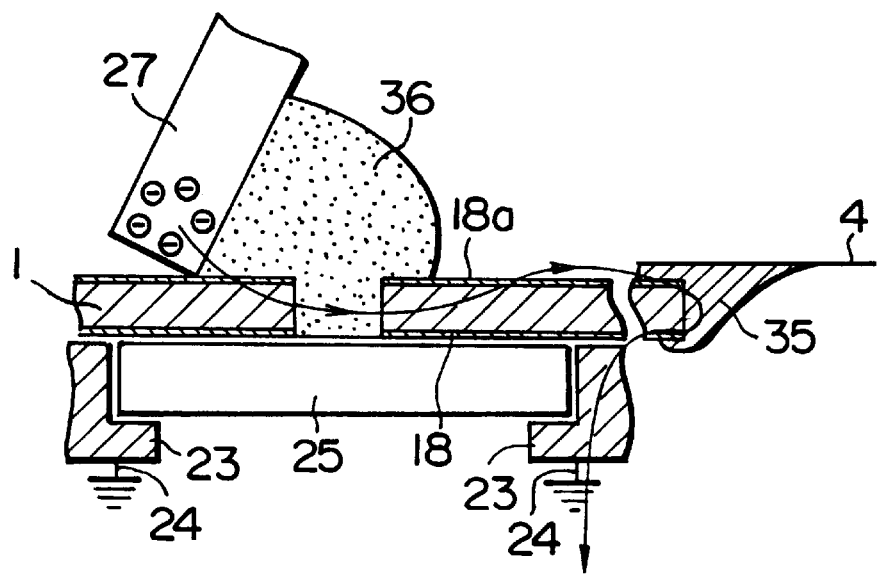
FIG. 20 is a schematic diagram in explanation of a method of paste printing by use of the second example of the plastic mask provided with an electroconductive layer.

FIG. 20 shows a method of printing an insulating solder paste 36 on a print-circuit board by use of the above-mentioned plastic mask. The same reference numerals as in FIG. 16 designate identical or corresponding parts in FIG. 20.

When printing is performed by use of this plastic mask, the surface of the electroconductive layer 18a of the plastic sheet 1 is rubbed by the tip of the urethane squeegee 27, so that triboelectric positive and negative charges are generated between the two. However, these charges are also grounded and dissipated as shown by the arrows through the upper electroconductive layer 18a, the electroconductive adhesive agent 35, the lower electroconductive layer 18, the clamps 23, and the earthing wire 24. Thus, the electrostatic charges generated when printing is performed by use of the insulating solder paste 36 can be completely dissipated, and therefore there is no risk of the electrostatic destruction of mounted electronic parts.

The above plastic mask can be used not only for the printing by use of the insulating paste, but also for the printing by use of electroconductive pastes.

Figure 21:
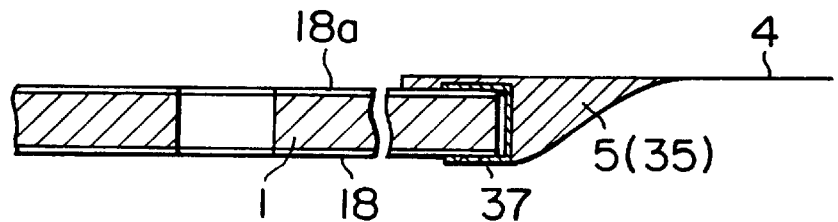
FIG. 21 is a schematic enlarged partial sectional view of a third example of a plastic mask provided with an electroconductive layer of the present invention.

FIG. 21 shows a third example of the plastic mask of the present invention. In this plastic mask, the electroconductive adhesive agent 35 shown in FIG. 19 is replaced by a metal foil 37 by which the upper and lower electroconductive layers 18a and 18 are electrically connected.

In this case, a conventional non-conductive adhesive agent may be employed as the adhesive agent 35 for having a mesh screen 4 to adhere to the plastic sheet 1. However, when the same electroconductive adhesive agent 35 as in FIG. 19 is employed instead of the conventional non-conductive adhesive agent, the conduction between the upper and lower electroconductive layers 18a and 18 can be secured.

The conduction between the upper and lower electroconductive layers 18a and 18 can be carried out by various methods, for example, a metal foil or lead wire is extended from each of the electroconductive layers 18a and 18 up to the position of the metal mask frame 3 (refer to FIG. 13) which is closely fixed to the body of the printer, the upper and lower electroconductive layers 18a and 18 are connected by the metal foil or lead wire through the metal mask frame 3.

The above-mentioned plastic mask can be employed not only for printing by use of a solder paste, but also for printing by use of other pastes.

A plastic mask for paste printing of the present invention, which comprises a plastic sheet comprising at least one penetrating opening containing area comprising a plurality of slit-shaped through-holes which are formed in a head-to-tail arrangement with a joint reinforcement portion between each of said slit-shaped through-holes in the head-to-tail arrangement, in a plurality of rows with the longer side of each of the slit-shaped through-holes being positioned side by side.

The above-mentioned plastic mask of the present invention and a method of paste printing by use of this plastic mask of the present invention will now be explained.

Figure 22:
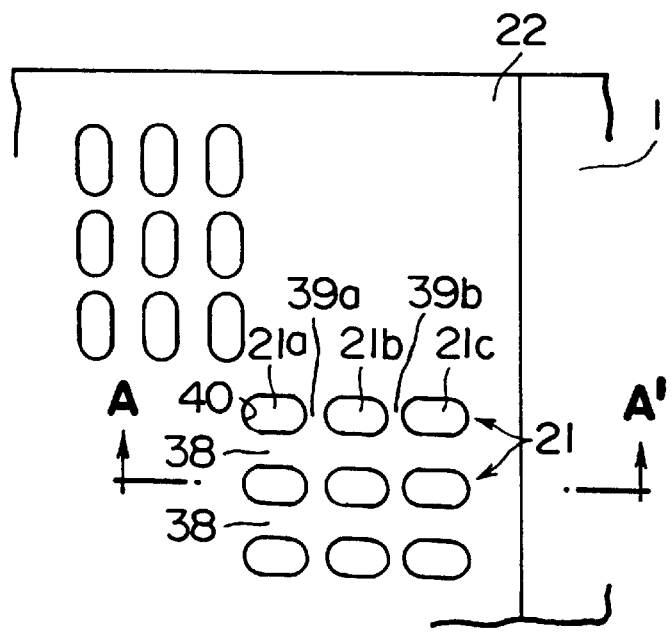
FIG. 22 in a schematic partial enlarged view of a penetrating opening containing area which comprises micro slit-shaped through-holes in a first example of a plastic mask comprising through-holes provided with reinforcement portions.
Figure 23:
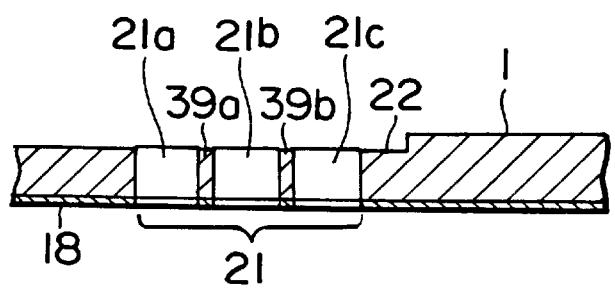
FIG. 23 in a cross-sectional view of the plastic mask taken on line A-A' of FIG. 22.

FIGS. 22 to 24 show a first specific example of the above plastic mask of the present invention.

FIG. 22 is a partial, enlarged view of a penetrating opening containing area which comprises micro slit-shaped through-holes in a half-etching portion shown in FIG. 24.

FIG. 23 is a cross-sectional view of the plastic mask taken on line A-A' of FIG. 22.

FIG. 24 is an overall plan view of the plastic mask, showing the structure thereof.

With reference to FIG. 24, the mask frame 3 is an aluminum square pipe. On the mask frame 3, a polyester mesh screen 4 with about 180 to 225 meshes is fixedly mounted with the application of a predetermined tension thereto. The polyester mesh screen 4 includes a cut-out area in the central portion thereof, and a plastic sheet 1 made of polyimide with a thickness of 125 μm is stuck on the polyester mesh screen 4 so as to cover the cut-out area thereof by an adhesive agent 5.

In the plastic sheet 1, there are formed large through-holes 19 for large electronic parts, medium through-holes 20 for ordinary electronic parts, and micro through-holes 21 for fine-pitch electronic parts, as illustrated in FIG. 24.

An area including the micro through-holes 21 constitutes a half-etching portion 22 which is made thinner than other areas, with a thickness in the range of about 15 to 25 μm.

The half-etching portion 22 which includes the above-mentioned micro through-holes 21 has a structure as shown in FIGS. 22 and 23.

Each micro through-hole 21 is slit-shaped and formed in the head-to-tail arrangement with a joint reinforcement portion between each of the slit-shaped through-holes, in a plurality of rows with the longer side of each of the slit-shaped through-holes being positioned side by side, with a narrow rib being formed therebetween.

With reference to FIG. 22, reference numerals 21a, 21b and 21c indicate specific micro slit-shaped through-holes; reference numeral 38 indicates the narrow rib which is formed between the slit-shaped through-holes 21a, 21b and 21c; and reference numerals 39a and 39b indicate the joint reinforcement portion between each of the slit-shaped through-holes 21a, 21b and 21c.

In each of the slit-shaped through-holes 21a, 21b and 21c, the opposite end portions 40 are rounded, whereby the concentration of stress on the end portions of each slit-shaped through-hole 21a, 21b or 21c is avoided.

The relationship of the above-mentioned slit-shaped through-holes 21a, 21b and 21c and the joint reinforcement portions 39a and 39b may also be considered that a conventional narrow rectangular slit-shaped through-hole 66 as shown in FIG. 25(a) is bridged with the two joint reinforcement portions 39a and 39b as shown in FIG. 25(b), so that the three divided slit-shaped through-holes 21a, 21b and 21c are resultantly formed as shown in FIG. 25(b).

With reference to FIG. 25(b), an example of a slit-shaped through-hole 21 composed of the three divided slit-shaped through-holes 21a, 21b and 21c will now explained with respect to the dimensions thereof.

The length (L) of the longer side of the slit-shaped through-hole 21 is, for instance, 1320 µm the width (W) of the opening of the slit-shaped through-hole 21 is, for instance, 150 µm and the width (t) of the joint reinforcement portion 39a, 39b, is, for instance, 120 µm.

The radium of curvature of the rounded end portion of each of the slit-shaped through-holes 21a, 21b and 21c is 60 µm.

An electroconductive layer 18 made of titanium with a thickness of about 2000 Å is provided on the lower surface of the plastic sheet 1 by sputtering deposition for the improvement of the plastic sheet 1 and for antistatic treatment.

The plastic mask with such a reinforcement portion 39a, 39b between the slit-shaped through-holes 21a, 21b and 21c as shown in FIG. 22 can be easily formed by appropriate selection of the shape of a light-shielding aperture mask for the irradiation of the plastic sheet 1 with an excimer laser beam and by the adjustment of the energy density of the excimer laser beam employed and the number of the irradiation pulses thereof.

Figure 26:
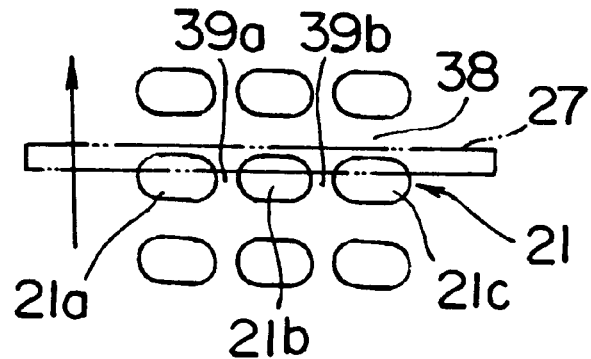
FIG. 26 schematically shows a printing method for printing a solder paste by use of the first example of the plastic mask comprising through-holes provided with reinforcement portions of the plastic mask, viewed from the above.
Figure 27:
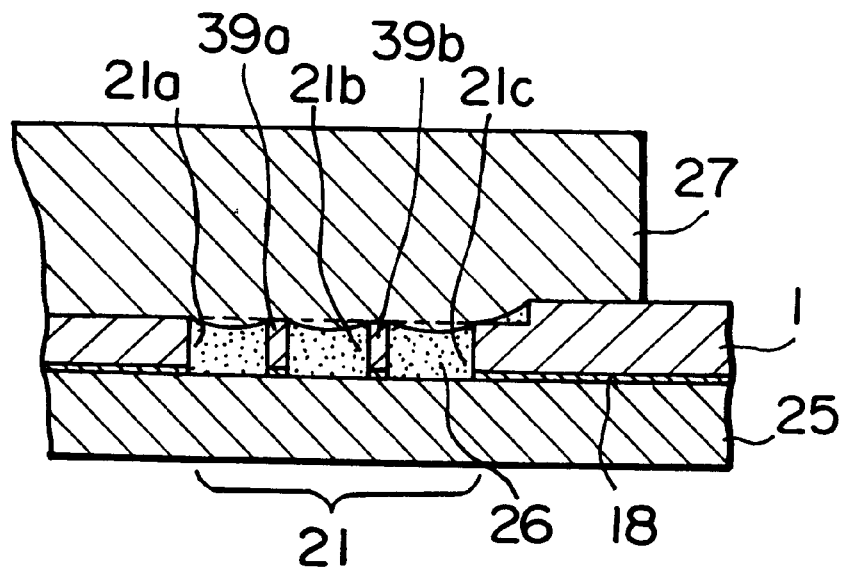
FIG. 27 shows the printing method shown in FIG. 26, viewed from behind a squeegee.

With reference to FIGS. 26 and 27, a method of printing an electroconductive solder paste 26 on a printed circuit board 25 for mounting electronic parts thereon by use of the above-mentioned plastic mask will now be explained.

Figure 32:
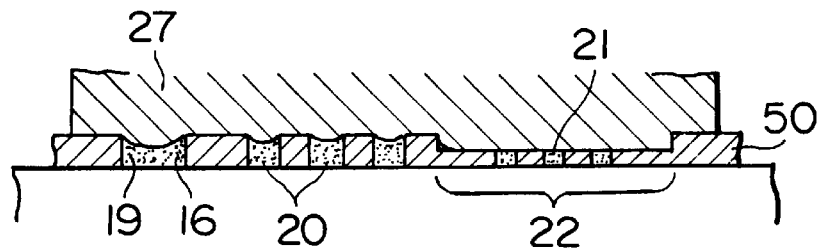
FIG. 32 in a schematic front croon-sectional view of a urethane squeegee during the printing at a half-etching portion.
Figure 33:
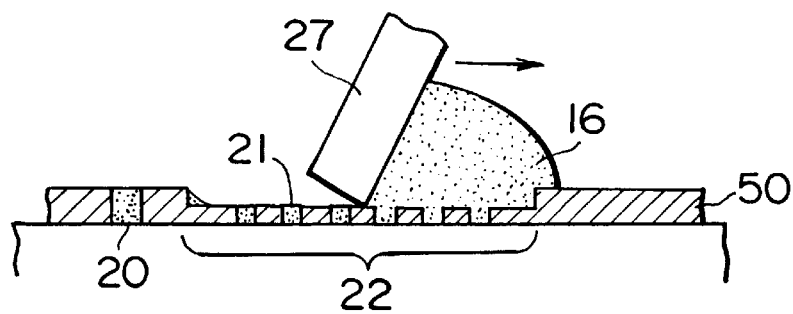
FIG. 33 is a schematic side cross-sectional view of the urethane squeegee during the printing at the half-etching portion in FIG. 32.
Figure 34:
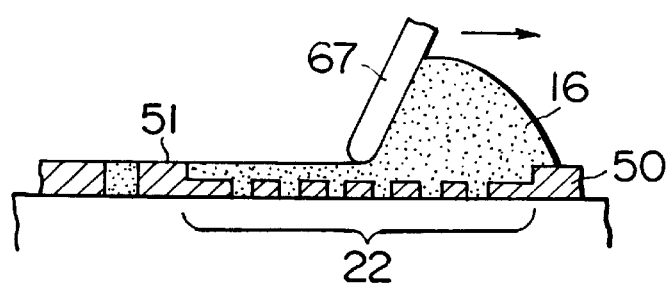
FIG. 34 is a schematic aide cross-sectional view of a metal squeegee during the printing at a half-etching portion.
Figure 35:
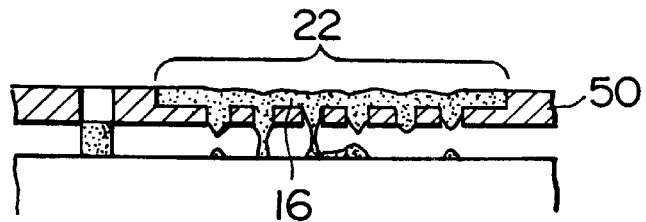
FIG. 35 is a schematic side cross-sectional view of a printed solder paster when a solder paste remains on the upper surface of a half-etching portion.
Figure 36:
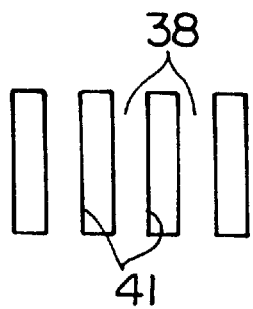
FIG. 36 in a schematic plan view of an example of a slit-shaped through-hole.
Figure 37:
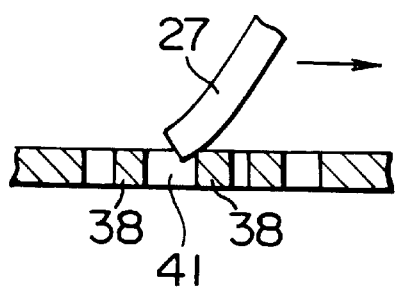
FIG. 37 is a schematic side view of the ribs of slit-shaped holes in explanation of the mechanism of the bending of the ribs.
Figure 38:
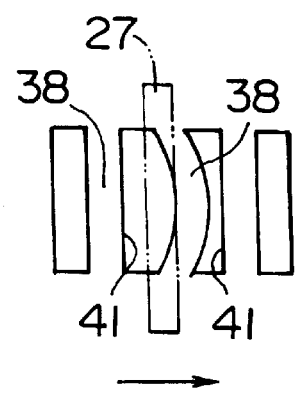
FIG. 38 is a schematic plan view of the ribs of slit-shaped holes in explanation of the mechanism of the bending of the ribs.

FIG. 26 shows the printing method for printing the solder paste by use of the plastic mask, viewed from the above. FIG. 27 shows the printing method shown in FIG. 26, viewed from behind a squeegee. This printing method is substantially the same as the conventional method which has already explained with reference to FIGS. 32 and 33, so the detailed explanation thereof is omitted.

When paste printing is performed by use of the above-mentioned plastic mask, a soft urethane squeegee 27 which is moved in the direction of the arrow enters each of the micro slit-shaped through-holes 21a, 21b and 21c during the course of paste printing, so that the rib 39 is pulled in the moving direction of the squeegee 27, but the micro slit-shaped through-holes 21a, 21b and 21c are held stationarily by the joint reinforcement portions 39a and 39b. Furthermore, the joint reinforcement portions 39a and 39b hinder the intrusion of the squeegee 27 into the micro slit-shaped through-holes 21a, 21b and 21c. Thus, the rib 38 in not bent since the force applied thereto is significantly reduced in comparison with conventional ribs which do not have the above-mentioned joint reinforcement portions 39a and 39b. Therefore, in the plastic mask of the present invention, there occurs no improper printing as caused by the sticking of the pastes in the adjacent through-holes.

Paste printing of a solder paste 26 comprising spherical solder solid particles with a particle size of 20 to 44 µm, with a viscosity of 1000 to 3000 p, was actually conducted by use of the previously mentioned plastic mask with a flat squeegee made of urethane elastomer with a Shore hardness of 90 under the conditions that the inclination angle of the flat squeegee was set at 60°, the printing pressure at 1.0 kg, the intrusion distance thereof at 0.13 mm, and the squeegee speed at 10 mm/sec. The result was that the maximum bending of the rib was as extremely small as 1.9 µm.

For comparison, by use of a conventional plastic mask with narrow rectangular slit-shaped through-holes 66 without the reinforcement portions as shown in FIG. 25(a), paste printing was conducted under the same conditions as mentioned above. The result was that the maximum bending of the rib was as large as 119 µm, indicating that the plastic mask of the present invention has a sufficient bending prevention effect on the ribs thereof for use in practice.

Figure 28:
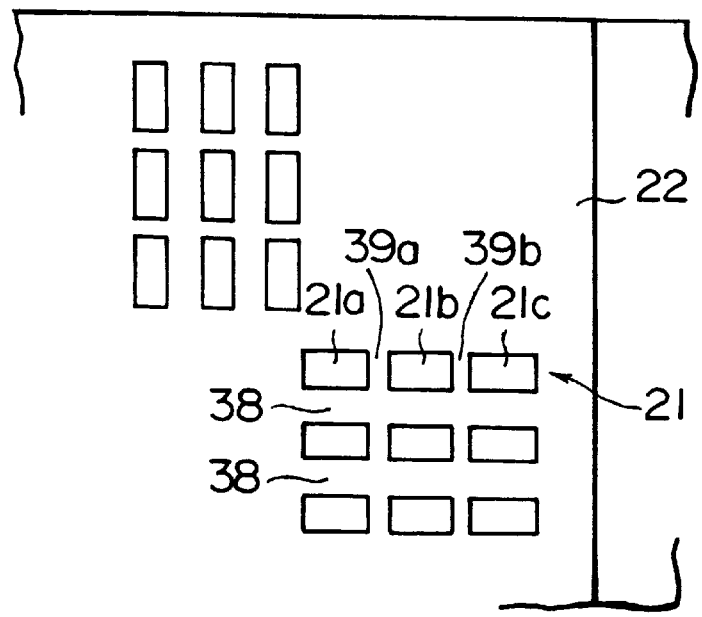
FIG. 28 is a schematic partial enlarged plan view of a second example of the plastic mask of the present invention, which has reinforcement portions for slit-shaped through-holes thereof.

FIG. 28 shows a second example of the plastic mask of the present invention, which has one or more reinforcement portions in each of the slit-shaped through-holes thereof.

In this second example of the plastic mask of the present invention, the opposite end portions of each of the slit-shaped through-holes 21a, 21b and 21c are not rounded, but angular, in contrast to the slit-shaped through-holes 21a, 21b and 21c of the first example as shown in FIG. 22.

When the opposite end portions of each of the slit-shaped through-holes 21a, 21b and 21c are not rounded, but remain angular as in this second example, the bass portions of the rib 38 tend to be more fatigued in comparison with those in the first example. However, in the present invention, the bending of the rib 38 is controlled to be minimized by the joint reinforcement portions 39a and 39b, so that the fatigue of the base portions of the rib 38 does not become any substantial problem.

Figure 29A:
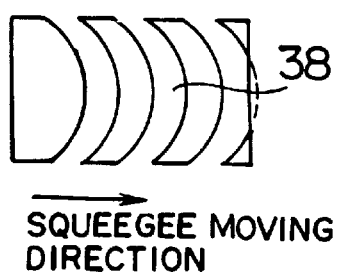
FIGS. 29(a), 29(b) and 29(c) are schematic diagrams in explanation of the reinforcement effect of the reinforcement portions for slit-shaped through-holes.
Figure 29B:
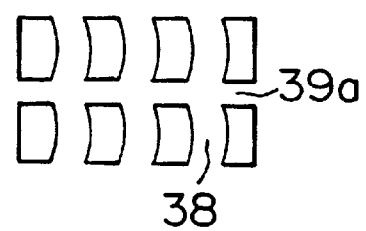
Figure 29C:
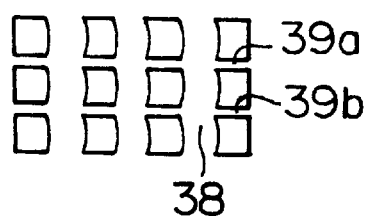

As illustrated in FIGS. 29(a) to 29(c), as the number of the reinforcement portions 39a and 39b is increased so as to increase the number of divided slit-shaped through-holes, the bending preventing effect on the respective ribs 38 is significantly increased to reduce the bending of each rib 38.

Furthermore, when the reinforcement portions 39a and 39b are arranged in line in the moving direction of the squeegee, the ribs 38 are supported by the reinforcement portions 39a and 39b arranged in line, so that the bending of the ribs 38 can be more effectively prevented.

As the material for the plastic sheet for the above plastic mask, the same materials as those for the previously described plastic sheets for use in the present invention can also be preferably employed. The provision of an electroconductive layer, the thickness and modulus of bending elasticity of the previously mentioned plastic masks of the present invention equally apply to the above-mentioned plastic mask.

Figure 30A:
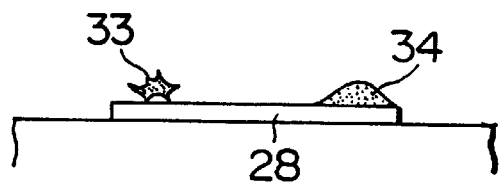
FIGS. 30(a), 30(b), 30(c), 30(d) and 30(e) are schematic diagrams in explanation of the effects of a foreign material or the like placed on a pad on a metal mask for paste printing.
Figure 30B:
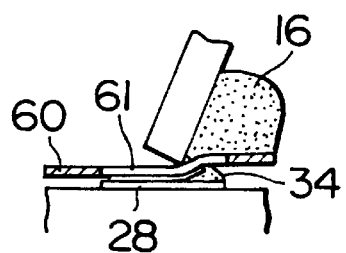
Figure 30C:
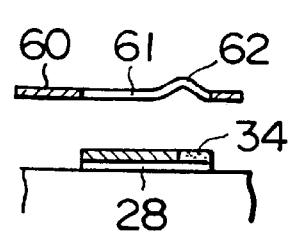
Figure 30D:
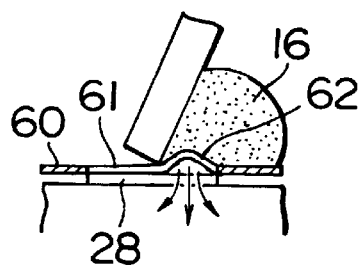
Figure 30E:
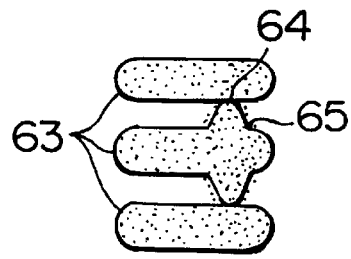

Of various conventional metal masks, an additive mask and a half-etching mask can be used almost in the same manner as the plastic mask of the present invention. The material for the additive mask and half-etching mask is usually nickel, which in much softer than SUS304 which is used for an etching mask. Therefore, when a foreign material 33 or a convex portion 34 formed by non-uniform soldering is present on a pad 28 for a print-circuit board as illustrated in FIG. 30(a), a deformation 62 is easily formed in the rib portion of a through-hole 61 of a metal mask 60 as illustrated in FIGS. 30(b) and 30(c), so that the paste 16 enters the back side portion of the metal mask from the deformed portion during the succeeding paste printing step an illustrated in FIG. 30(d). Eventually, there is caused improper printing with a short-circuit 64 and solder balls 65 as illustrated in FIG. 30(e).

Figure 31A:
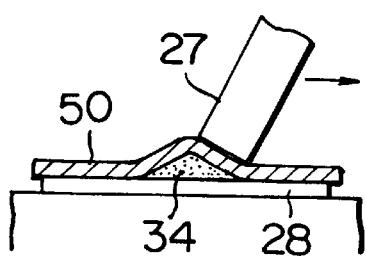
FIGS. 31(a) and 31(b) are schematic diagrams in explanation of the state of a plastic mask affected by a foreign material or the like on a pad.
Figure 31B:
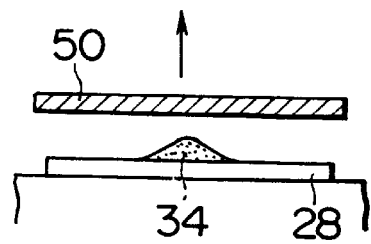

In sharp contrast to this, the plastic mask 50 is flexible and therefore capable of coming into close contact with the surface of a print-circuit board as illustrated in FIG. 31(a); and when the plastic mask 50 is peeled away from the print-circuit board, the plastic mask 50 quickly returns to its original flat shape without any deformation because of its flexibility as illustrated in FIG. 31(b). Therefore in comparison with the conventional metal masks, the above-mentioned improper printing rarely occurs in the plastic mask 50.

Furthermore, the additive mask and half-etching mask are fabricated by plating, and the plated surface has alight roughness, so that when a paste which contains relatively soft solid particles, such as a solder paste, enters behind the mask, the solid particles are depressed between a printing material and the mask and fixed to the rough surface thereof. The solid particles fixed to the back side of the mask hinders the close contact of the mask with the printing material, and when the solid particles enters the through-holes, the paste-passing performance thereof is significantly degraded.

In contrast to this, the plastic mask of the present invention has an extremely smooth surface and substantially no solid particles contained in the paste are not fixed to the back side surface of the plastic mask of the present invention, so that paste printing can be repeated without forming gaps between the plastic mask and the printing material.

Thus, according to the paste printing method of the present invention, a paste pattern which accurately corresponds to the pattern of the through-holes formed in the plastic mask of the present invention can be printed with high quality and high precision on a printing material.

Furthermore, according to the paste printing method of the present invention, paste printing can be repeated a number of times without the necessity for wiping or cleaning the back aide of the plastic mask.

What is claimed is:

1. A plastic mask for paste printing comprising a plastic shoot comprising at least one penetrating opening containing area which comprises at least one through-hole therein, said penetrating opening containing area being formed by said plastic sheet being irradiated with an excimer laser beam, with the depth of each of said through-holes of said penetrating opening containing area measured from the top surface of said plastic mask to the narrowest portion of each of said through-holes in said penetrating opening containing area being 10 $\mu$m or less.

2. The plastic mask for paste printing as claimed in claim 1, having a thickness of 10 to 500 $\mu$m and a modulus of bending elasticity of 20 to 500 Kgf·mm$^{-2}$.

3. A plastic mask for paste printing comprising:
a plastic sheet with a penetrating opening containing area comprising at least one through-hole, and
an electroconductive layer formed on each opposite upper and lower surface of said plastic sheet, wherein the electroconductive layers are electrically connected to each other.

4. The plastic mask for paste printing as claimed in claim 3, wherein said two electroconductive layers are electrically connected with each other through an electroconductive adhesive agent.

5. The plastic mask for paste printing as claimed in claim 3, wherein each electroconductive layer is an abrasion resistant electroconductive layer.

6. The plastic mask for paste printing as claimed in claim 4, wherein each of said electroconductive layers is an abrasion resistant electroconductive layer.

7. The plastic mask for paste printing as claimed in claim 3, wherein each electroconductive layer is a titanium coating electroconductive layer.

8. The plastic mask for paste printing as claimed in claim 4, wherein each of said electroconductive layers is a titanium coating electroconductive layer.

9. A plastic mask for paste printing comprising:
a plastic sheet comprising at least one penetrating opening containing area comprising a plurality of slit-shaped through-holes which are formed in a head-to-tail arrangement with a joint reinforcement portion between each of said slit-shaped through-holes in said head-to-tail arrangement, said slit-shaped through-holes being further arranged in a plurality of rows with the longer side of each of said slit-shaped through-holes being positioned side by side.

10. The plastic mask for paste printing as claimed in claim 9, wherein ends of each of said slit-shaped through-holes portions are rounded.

11. The plastic mask for paste printing as claimed in claim 9, wherein said rows of said slit-shaped through-holes are arranged in parallel to each other, and said joint reinforcement portions are disposed in line at a predetermined angle with respect to said parallel rows of said slit-shaped through-holes.

12. The plastic mask for paste printing an claimed in claim 10, wherein said joint reinforcement portions are arranged in line at a predetermined angle with respect to each row of said slit-shaped through-holes.

* * * * *

UNITED STATES PATENT AND TRADEMARK OFFICE
CERTIFICATE OF CORRECTION

PATENT NO. : 6,063,476
DATED : May 16, 2000
INVENTOR(S) : Makoto Kinoshita

It is certified that error appears in the above-identified patent and that said Letters Patent is hereby corrected as shown below:

Column 4, line 49, change "stopped" to --stepped--.

Column 5, line 10, after the word "thereof" change "," to --.--;

line 19, after "mask" change "when" to --When--.

Column 6, line 21, change "1a" to --is--;

line 50, delete "-".

Column 7, line 44, change "came" to --case--.

Column 8, line 6, change "print-circuit" to --printed-circuit--;

line 28, change "anormous" to --enormous--;

line 37, change "an" to --as--;

line 67, change "plat" to --plate--.

Column 9, line 32, change "banding" to --bending--;

line 46, change "in" to --is--;

line 62, change "banding" to --bending--.

Column 10, line 9, change "in" to --is--;

line 21, change "pants" to --paste--.

Column 12, line 1, change "and" to --end--;

line 67, change "pauses" to --passes--.

Column 13, lines 37 and 39, change "print-circuit" to --printed-circuit--.

UNITED STATES PATENT AND TRADEMARK OFFICE
CERTIFICATE OF CORRECTION

PATENT NO. : 6,063,476
DATED : May 16, 2000
INVENTOR(S) : Makoto Kinoshita

It is certified that error appears in the above-identified patent and that said Letters Patent is hereby corrected as shown below:

Column 14, line 23, change "aide" to --side--.

Column 16, line 64, change "flled" to --filled--.

Column 17, line 33, change "shoot" to --sheet--.

Column 19, line 13, change "bq" to --be--;

line 14, change "banding" to --bending--;

line 52, change "hat" to --that--;

line 53, change "an" to --as--.

Column 20, lines 1-2, change "binding" to --bending--;

line 21, change "aide" to --side--;

line 49, change "an" to --as--.

Column 21, line 65, change "AA" to --As--.

Column 22, line 13, change "beam has" to --beams have--.

Column 23, line 13, change "id" to --1d--.

Column 24, line 24, change "applaud" to --applied--;

line 58, change "Intensity" to --intensity--.

Column 25, line 39, change "shoot" to --sheet--;

line 66, delete ";" after the word "mask".

UNITED STATES PATENT AND TRADEMARK OFFICE
CERTIFICATE OF CORRECTION

PATENT NO. : 6,063,476
DATED : May 16, 2000
INVENTOR(S) : Makoto Kinoshita

It is certified that error appears in the above-identified patent and that said Letters Patent is hereby corrected as shown below:

Column 26, line 4, change "pants" to --paste--;

line 11, change "cringing" to --bringing--;

line 17, change "taste-filling" to --paste-filling--;

line 46. change "felled" to --filled--.

Column 27, line 1, change "wren" to --when--;

line 6, change "ci %-he" to --on the--;

line 10, change "i8" to --is--;

line 27, change "paste-pas sing" to --paste-passing--;

line 60, change "An" to --As--.

Column 29, line 16, change "end" to --and--;

line 23, change "a" to --is--;

line 27, change "Fig. 6" to --Fig. 16--.

Column 30, line 10, change "16" to --18--;

lines 16, 20, 23, 26, 36, 38, 54, and 65, change "print-circuit" to --printed circuit--;

line 43, change "19" to --18--;

line 55, change "print-" to --printed---;

line 57, change "Each" to --such--.

Column 31, line 11, change "de" to --as--;

UNITED STATES PATENT AND TRADEMARK OFFICE
CERTIFICATE OF CORRECTION

PATENT NO. : 6,063,476
DATED : May 16, 2000
INVENTOR(S) : Makoto Kinoshita

It is certified that error appears in the above-identified patent and that said Letters Patent is hereby corrected as shown below:

line 35, change "print-circuit" to --printed-circuit--.

Column 33, line 51, change "39" to --38--.

Column 34, line 25, change "bass" to --base--;

line 57, change "print-circuit" to --printed-circuit--.

Column 35, lines 1 and 3, change "print-circuit" to --print-circuit--;

line 34, change "aide" to --side--.

Signed and Sealed this

Seventeenth Day of April, 2001

Attest:

NICHOLAS P. GODICI

*Attesting Officer*     *Acting Director of the United States Patent and Trademark Office*